(12) United States Patent
Cheng et al.

(10) Patent No.: US 8,394,710 B2
(45) Date of Patent: Mar. 12, 2013

(54) SEMICONDUCTOR DEVICES FABRICATED BY DOPED MATERIAL LAYER AS DOPANT SOURCE

(75) Inventors: Kangguo Cheng, Guilderland, NY (US);
Bruce B. Doris, Brewster, NY (US);
Balasubramanian S. Haran, Watervliet, NY (US); Ali Khakifirooz, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 12/819,440

(22) Filed: Jun. 21, 2010

(65) Prior Publication Data

US 2011/0309333 A1    Dec. 22, 2011

(51) Int. Cl.
*H01L 21/22* (2006.01)
*H01L 21/38* (2006.01)
(52) U.S. Cl. ........ 438/558; 977/741; 977/749; 977/938; 257/E21.144
(58) Field of Classification Search .................. 438/558; 977/938, 741, 749; 257/E21.144
See application file for complete search history.

(56) References Cited

U.S. PATENT DOCUMENTS

| | | | |
|---|---|---|---|
| 3,852,086 A | 12/1974 | Murata et al. | |
| 4,798,764 A | 1/1989 | Tressler et al. | |
| 5,550,082 A | 8/1996 | Wolfe et al. | |
| 5,770,490 A * | 6/1998 | Frenette et al. | 438/199 |
| 5,827,768 A * | 10/1998 | Lin et al. | 438/300 |
| 7,202,123 B1 * | 4/2007 | Pan | 438/197 |
| 2004/0094807 A1 * | 5/2004 | Chau et al. | 257/401 |
| 2005/0250317 A1 * | 11/2005 | Koh et al. | 438/653 |
| 2010/0176424 A1 * | 7/2010 | Yeo et al. | 257/255 |

FOREIGN PATENT DOCUMENTS

JP      08115920 A  *  5/1996

* cited by examiner

*Primary Examiner* — Jarrett Stark
(74) *Attorney, Agent, or Firm* — Scully, Scott, Murphy & Presser, P.C.; H. Daniel Schnurmann

(57) ABSTRACT

A method of forming a semiconductor device is provided, in which the dopant for the source and drain regions is introduced from a doped dielectric layer. In one example, a gate structure is formed on a semiconductor layer of an SOI substrate, in which the thickness of the semiconductor layer is less than 10 nm. A doped dielectric layer is formed over at least the portion of the semiconductor layer that is adjacent to the gate structure. The dopant from the doped dielectric layer is driven into the portion of the semiconductor layer that is adjacent to the gate structure. The dopant diffused into the semiconductor provides source and drain extension regions.

12 Claims, 13 Drawing Sheets

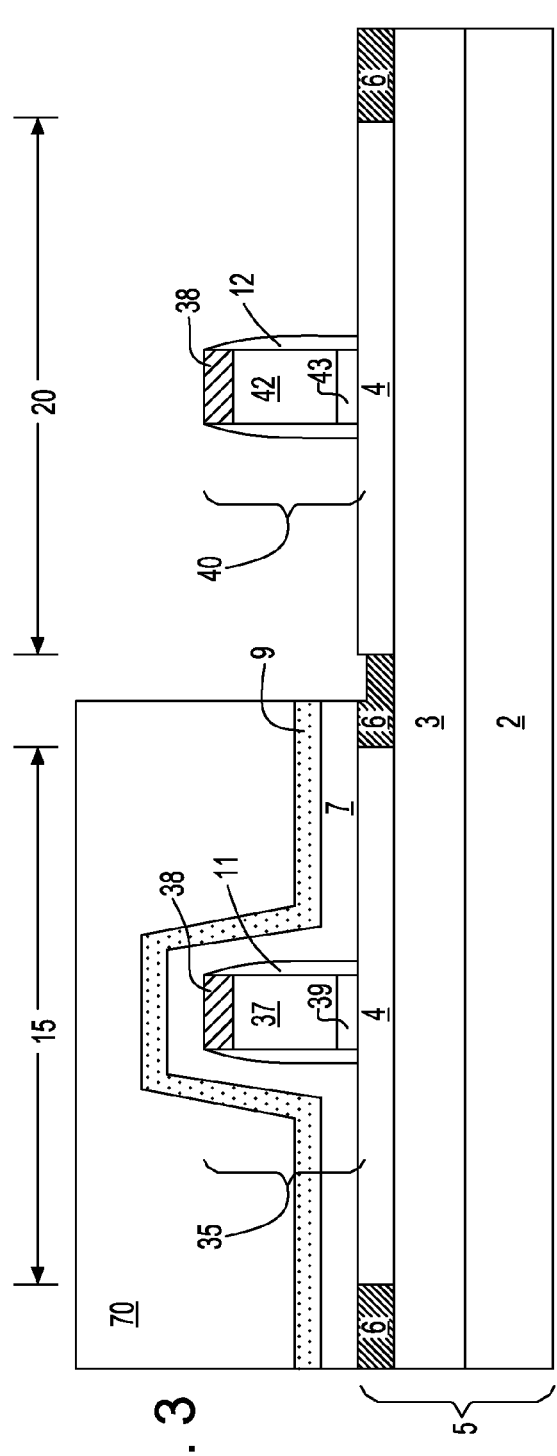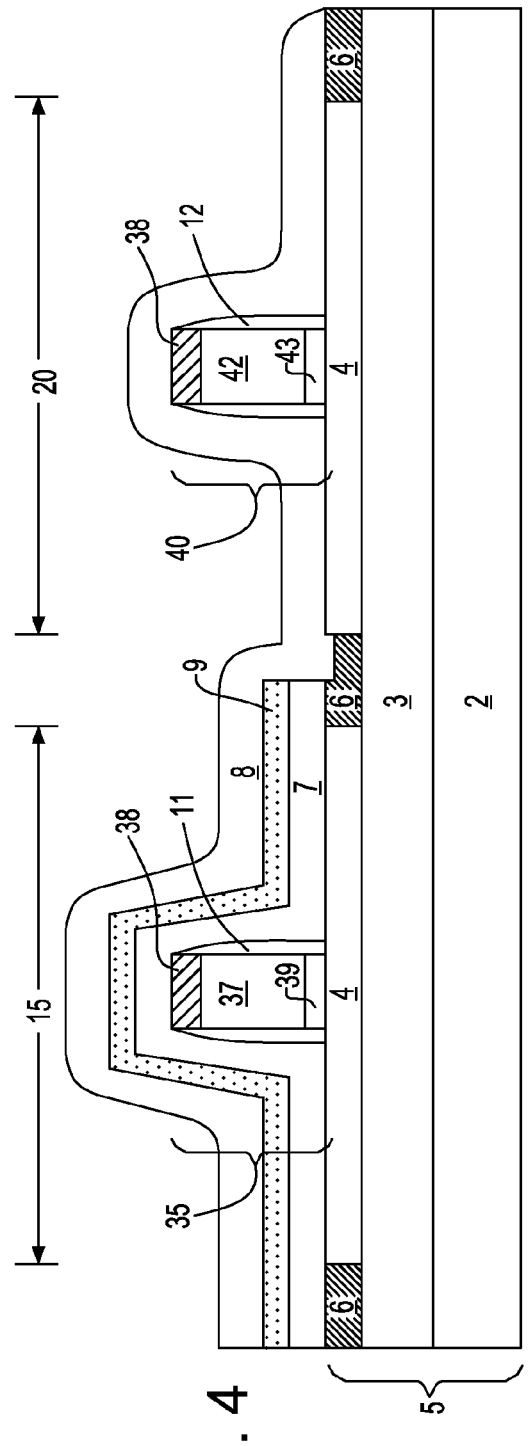

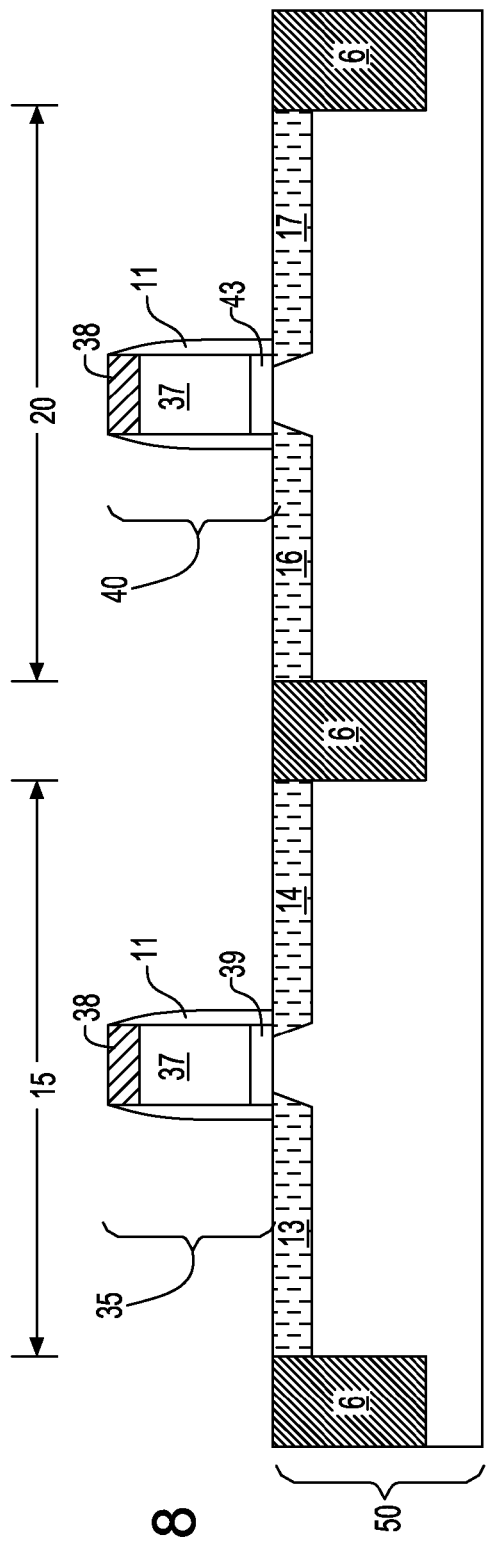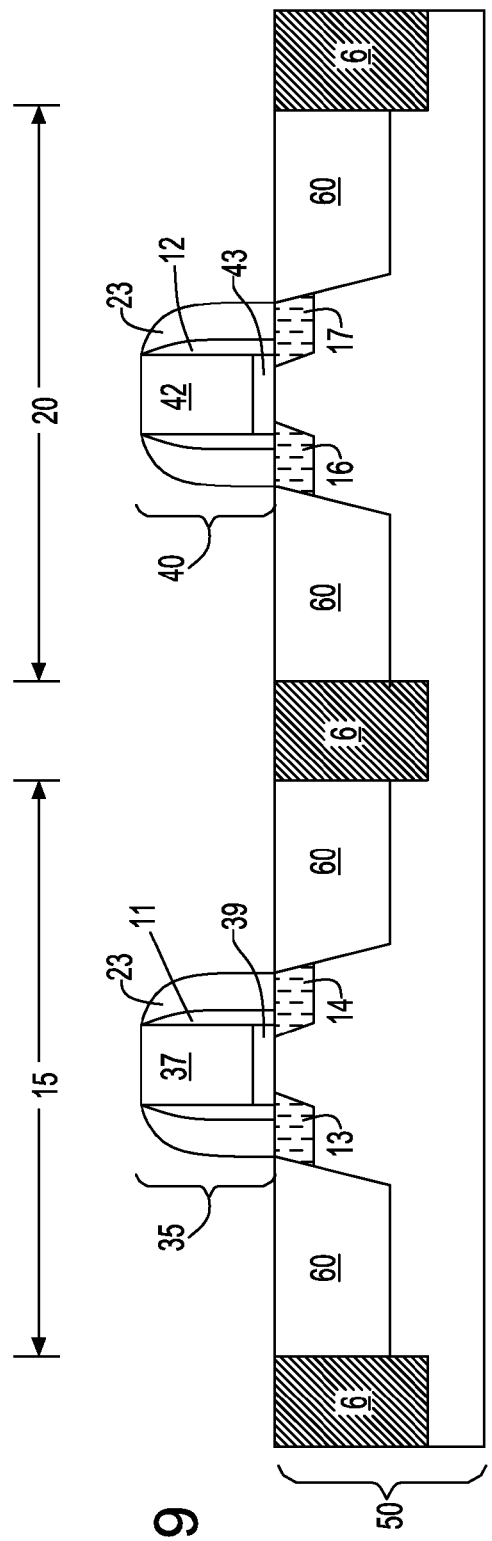

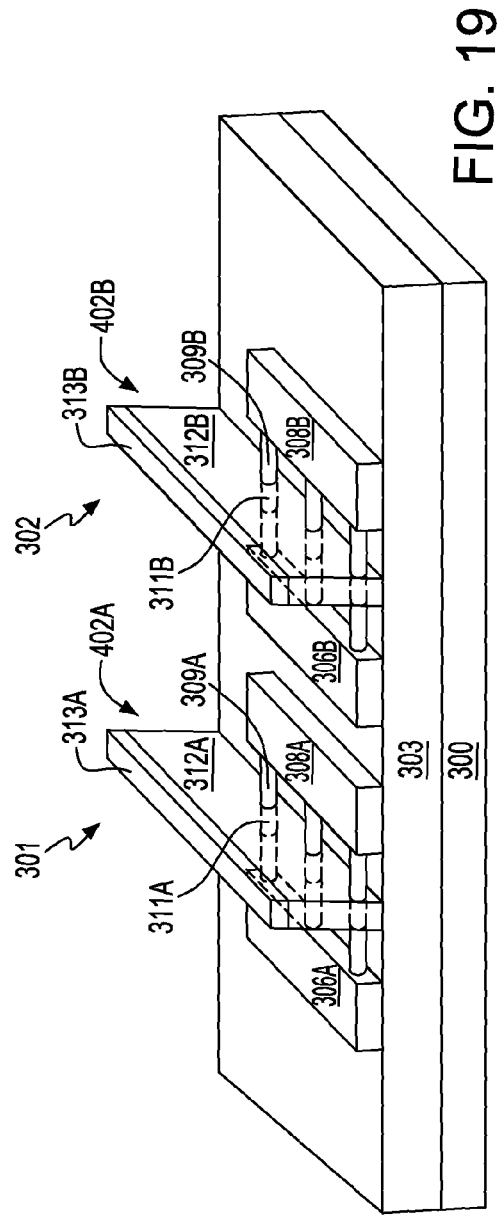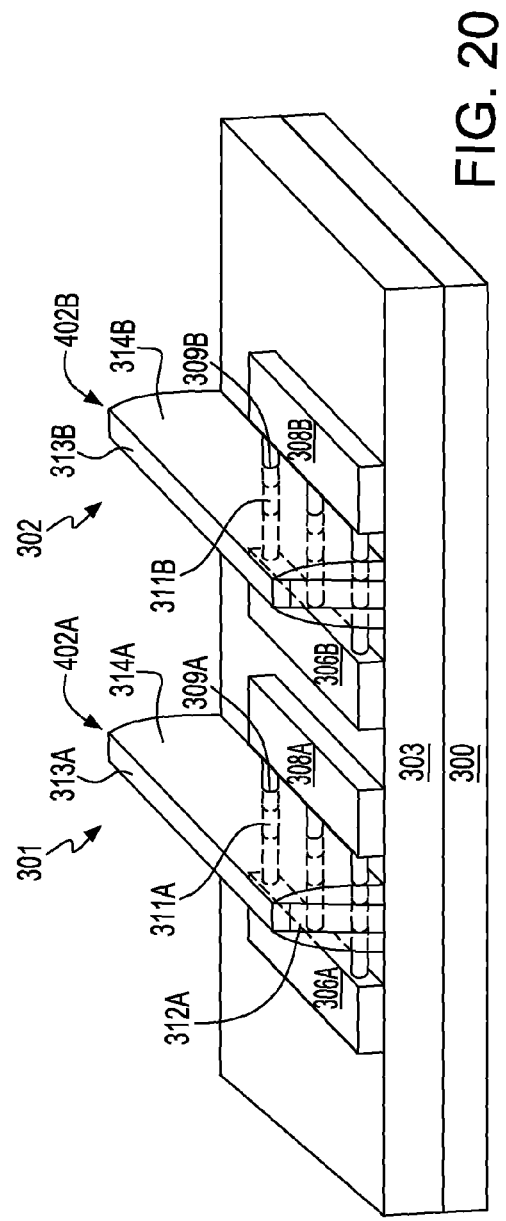

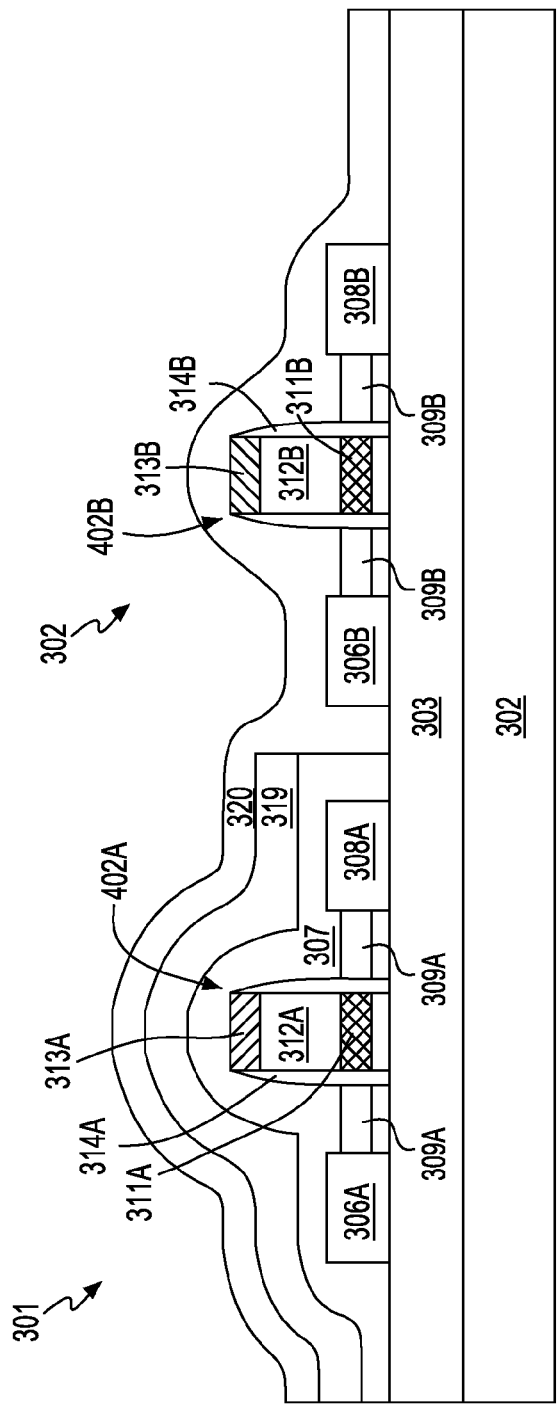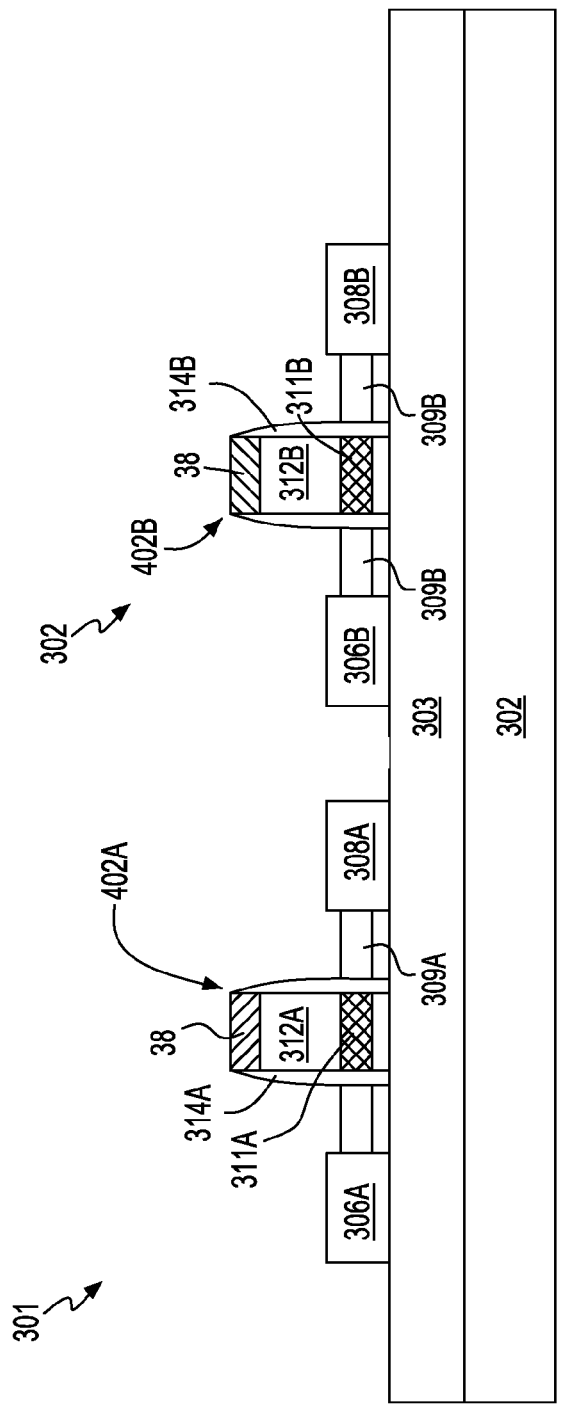

SEMICONDUCTOR DEVICES FABRICATED BY DOPED MATERIAL LAYER AS DOPANT SOURCE

BACKGROUND

The present disclosure relates to semiconductor devices and methods of forming semiconductor devices.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, methods for improving performance without scaling have become critical.

SUMMARY

In one embodiment, a method of providing a semiconductor device is provided, in which the dopant for the source and drain extension regions is introduced from a doped material layer, such as a doped dielectric layer. In one example, a gate structure is formed on a semiconductor surface of a substrate. A doped dielectric layer is formed over at least the portion of the semiconductor surface that is adjacent to the gate structure. The dopant from the doped material is driven into the portion of the semiconductor surface that is adjacent to the gate structure. The dopant provides source and drain regions in the semiconductor surface. The doped material layer is removed to expose the semiconductor surface. Raised source and drain regions are formed on the semiconductor surface on opposing sides of the gate structure.

In yet another embodiment, a method of forming a finFET is provided that includes forming a gate structure on a portion of a fin structure, wherein exposed portions of the fin structure are present on opposing sides of the gate structure. The fin structure includes a fin cap present on the upper surface of a semiconductor material. Spacers are formed on the sidewall of the fin gate structure. A doped dielectric layer is formed on exposed portions of the semiconductor material of the fin structure that are adjacent to the gate structure. The dopant from the doped dielectric layer is driven into the exposed portions of the semiconductor material of the fin structure on opposing sides of the gate structure. The dopant provides source and drain extension regions in the semiconductor material of the fin structure. The doped dielectric layer is removed. Raised source regions and raised drain regions are formed on the exposed portions of the semiconductor material of the fin structure. The source regions and the drain regions may merge each other after raised source/drain process.

In another embodiment, a method of forming a complementary metal oxide semiconductor (CMOS) device is provided. In one example, the method includes providing a semiconductor substrate having a first region and a second region. Forming a first gate structure in the first region of the semiconductor substrate and a second gate structure in the second region of the semiconductor substrate. A first material layer doped with a first conductivity type dopant is formed over the first region of the semiconductor substrate, and a second material layer doped with a second conductivity type dopant is formed over the second region of the semiconductor substrate. The first conductivity type dopant is of an opposite conductivity than the second conductivity type dopant. The first conductivity type dopant is diffused into the first region of the semiconductor substrate on opposing sides of the first gate structure, and the second conductivity type dopant is diffused into the second region of the semiconductor substrate on opposing sides of the second gate structure. The first conductivity type dopant that is diffused into the first region of the semiconductor substrate provides a first conductivity type source extension region and drain extension region. The second conductivity type dopant that is diffused into the second region of the semiconductor substrate provides a second conductivity type source extension region and drain extension region. The first material layer and the second material layer are removed. Raised source and drain regions are formed on the upper surface of the semiconductor layer on opposing sides of the gate structure.

In another embodiment, a semiconductor device is provided including a source region and a drain region that are present in a single crystal semiconductor layer having a thickness of less than 10 nm. In one embodiment, the semiconductor device includes a gate structure on a first portion of a semiconductor layer having a thickness of less than 10 nm. Source regions and drain regions are formed in the semiconductor layer on opposing sides of the gate structure, in which the source regions and drain regions extend an entire thickness of the semiconductor layer. The crystal structure of the source region and the drain region in the semiconductor layer is substantially damage-free.

In another embodiment, a finFET device is provided that includes a gate structure on a portion of a fin structure having a width of less than 10 nm. The fin structure includes a dielectric cap present on a semiconductor material, wherein exposed portions of the fin structure are on opposing sides of the gate structure. Source and drain extension regions are present in the semiconductor material of the fin structure on opposing sides of the gate structure. The source and drain extensions have a crystal that is substantially damage-free.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 3 is a side cross-sectional view depicting forming a block mask on the at least one dielectric layer in the first region, and etching an exposed portion of the at least one dielectric layer and an underlying portion of the first material layer doped with the first conductivity type dopant selective to the block mask to expose at least the semiconductor layer in the second region of the semiconductor substrate, in accordance with one embodiment of the present disclosure.

FIG. 4 is a side cross-sectional view depicting removing the block mask, and depositing the second material layer doped with the second conductivity type dopant in direct contact with a remaining portion of the at least one dielectric layer in the first region and in direct contact with the semiconductor layer in the second region of the semiconductor substrate, in accordance with one embodiment of the present disclosure.

FIG. 8 is a side cross-sectional view depicting a final semiconductor structure including a bulk semiconductor substrate, in accordance with one embodiment of the present disclosure.

FIG. 9 is a side cross-sectional view depicting a final semiconductor structure including a bulk semiconductor substrate having strained well regions present therein, in accordance with one embodiment of the present disclosure.

FIG. 19 is a perspective view of forming a first and second gate structures in direct contact with the first and second nanowire portions of the substrate, in accordance with one embodiment of the present disclosure.

FIG. 20 is a perspective view of forming a spacer along the sidewalls of the first and second gate structures depicted in FIG. 19, in accordance with one embodiment of the present disclosure.

FIG. 23 is a side cross-sectional view depicting removing the block mask and depositing a second material layer doped with the second conductivity type dopant in direct contact with a remaining portion of the at least one dielectric layer, and in direct contact with the second nanowire portion, in accordance with one embodiment of the present disclosure.

FIG. 24 is a side cross-sectional view depicting driving the first conductivity dopant from the first material layer into the first nanowire portion, and driving the second conductivity type dopant from the second material layer into the second nanowire portion, in accordance with one embodiment of the present disclosure.

DETAILED DESCRIPTION

Figure 1:
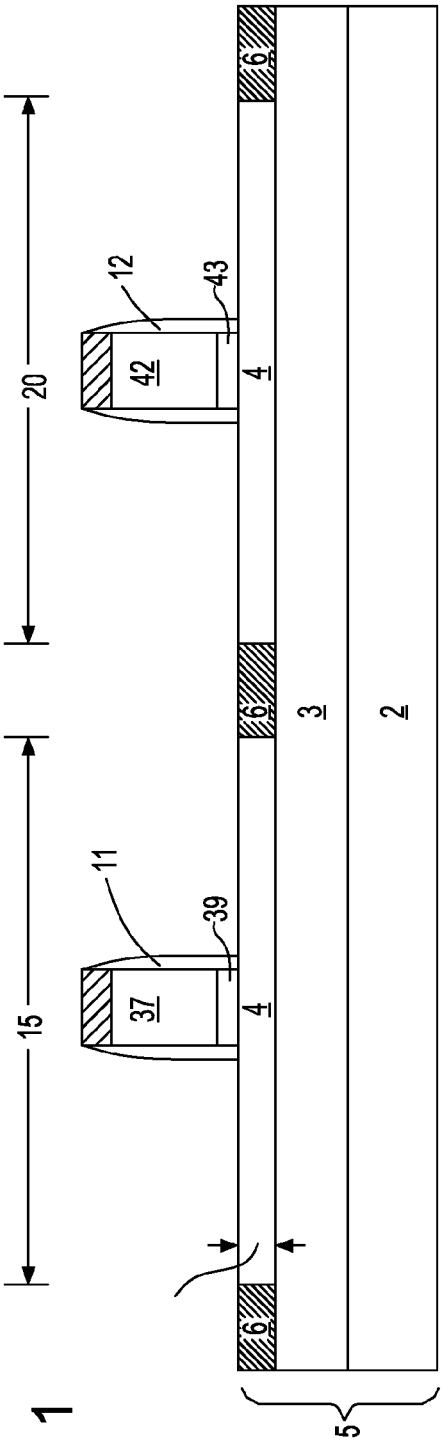
FIG. 1 is a side cross-sectional view of forming a first gate structure in a first region of the semiconductor substrate and a second gate structure in a second region of the semiconductor substrate, in accordance with one embodiment of the present disclosure.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to methods for producing semiconductor devices in which a material layer that is deposited over a gate structure and adjacent portions of the substrate is used to introduce a dopant for the source and drain extension regions without ion implantation. A semiconductor device is an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. As used herein, the term "conductivity type" denotes a dopant region being p-type or n-type. In one embodiment, introducing the dopant into the source and drain extension regions using the doped material layer in combination with a driving anneal avoids damaging the crystal structure of the semiconductor material in which the source and drain extension regions are positioned.

In one example, the crystal structure of the source and drain extension region that is provided in the present method and structure is a single crystal semiconductor material. A single crystal semiconductor material is a crystalline solid in which atoms are arranged following a specific pattern throughout the entire piece of the material; i.e., a long-range order exists throughout. In contrast, a polycrystalline material is a material in which a long-range order exists only within a portion of the grains, wherein the grains are randomly connected to form a solid. In a polycrystalline material there is no preferential extension of the single-crystal within the grain in any direction. In contrast to polycrystalline and single crystal materials, an amorphous material is a non-crystalline solid with no periodicity and no long-range order at all.

The introduction of a dopant to the source and drain extension regions by diffusing the dopant into an underlying semiconductor layer is suitable for forming single crystal source and drain extension regions in planar semiconductor devices positioned on extremely thin semiconductor on insulator (ETSOI) substrates. By "extremely thin semiconductor on insulator" it is meant that the upper semiconductor layer, which is present on a buried insulating layer, has a thickness of 10 nm or less. It has been determined that the use of ion implantation to form source and drain extension regions disrupts the single crystal orientation of the semiconductor material, and when employed in ETSOI substrates impacts the entire depth of the crystal structure of the upper semiconductor so that there is no remaining single crystal material that may be used in a regrowth step. Therefore, the damage caused by the ion implantation results in an ETSOI layer having a high resistance, which results from the amorphous or polycrystalline source and drain extension regions. In one embodiment, the present method avoids ion implantation of the source and drain extension regions.

FIGS. 1-6 depict one embodiment of a method for forming a planar semiconductor device, such as a field effect transistor on a substrate. A planar semiconductor device is a semiconductor device in which the current flow through the channel of the device is in a direction that is parallel to the upper surface of the substrate on which the semiconductor device is formed. As used herein, the channel is the region between the source and drain of a semiconductor device that becomes conductive when the semiconductor device is turned on. The drain is the doped region in semiconductor device located at the end of the channel, in which carriers are flowing out of the semiconductor through the drain. The term source is a doped region in the semiconductor device, in which majority carriers are flowing into the channel. In one embodiment, the semiconductor device is a field effect transistor (FET). As used herein a "field effect transistor" is a transistor in which output current, i.e., source-drain current, is controlled by the voltage applied to a gate structure. A field effect transistor has three terminals, i.e., gate structure, source and drain. The gate structure is a structure used to control output current (i.e., flow of carriers in the channel) of a semiconducting device, such as a field effect transistor, through electrical or magnetic fields. In one embodiment, the present disclosure avoids damaging the crystal structure of the substrate by forming a doped material layer on the upper semiconductor layer, e.g., ETSOI layer, of the substrate after the gate structures have been formed, and then diffusing the dopant from the doped material layer into the upper semiconductor layer, e.g., ETSOI layer, using an anneal process.

FIG. 1 depicts one embodiment of a substrate 5 having a first region 15 and a second region 20, in which a first gate structure 35 is present in the first region 15 and a second gate structure 40 is present in the second region 20. The substrate 5 may be a semiconductor on insulator (SOI) substrate. In the embodiments, in which the substrate 5 is an SOI substrate, the substrate 5 is typically composed of at least a first semiconductor layer 4 (hereafter referred to as an ETSOI layer 4) overlying a dielectric layer 3, wherein the ETSOI layer 4 has a thickness T1 of less than 10 nm. A second semiconductor layer 2 may be present underlying the dielectric layer 3.

The ETSOI layer 4 may comprise any semiconducting material including, but not limited to: Si, strained Si, SiC, SiGe, SiGeC, Si alloys, Ge, Ge alloys, GaAs, InAs, and InP, or any combination thereof. The ETSOI layer 4 may be thinned to a desired thickness by planarization, grinding, wet etch, dry etch or any combination thereof. One method of thinning the ETSOI layer 4 is to oxidize the Si by a thermal dry or wet oxidation process, and then wet etch the oxide layer using a hydrofluoric acid mixture. This process can be repeated to achieve the desired thickness. In one embodiment, the ETSOI layer 4 has a thickness ranging from 1.0 nm to 10.0 nm. In another embodiment, the ETSOI layer 4 has a thickness ranging from 1.0 nm to 5.0 nm. In a further embodiment, the ETSOI layer 4 has a thickness ranging from 3.0 nm to 8.0 nm. The second semiconductor layer 2 may be a semiconducting material including, but not limited to: Si, strained Si, SiC, SiGe, SiGeC, Si alloys, Ge, Ge alloys, GaAs, InAs, InP as well as other III/V and II/VI compound semiconductors.

The dielectric layer 3 that may be present underlying the ETSOI layer 4 and atop the second semiconductor layer 2 may be formed by implanting a high-energy dopant into the substrate 5 and then annealing the structure to form a buried oxide layer, i.e., dielectric layer 3. In another embodiment, the dielectric layer 3 may be deposited or grown prior to the formation of the ETSOI layer 4. In yet another embodiment, the substrate 5 may be formed using wafer-bonding techniques, where a bonded wafer pair is formed utilizing glue, adhesive polymer, or direct bonding.

In one embodiment, the substrate 5 includes a first region 15 and a second region 20. The positioning of the first region 15 and the second region 20 may be determined by forming an isolation region 6 through the ETSOI layer 4 and, in some embodiments, into contact with the dielectric layer 3. In another embodiment, the isolation region 6 is a trench filled with an insulating material, such as an oxide, nitride, or oxynitride. In another embodiment, the isolation region 6 is a shallow trench isolation (STI) region. In a further embodiment, the shallow trench isolation region 6 may be formed by etching a trench in the substrate 5 utilizing a dry etching process, such as reactive-ion etching (RIE) or plasma etching. In a yet further embodiment, etching of the trench may include depositing an insulating material having a composition different than the dielectric layer 3, such as a nitride when the dielectric layer 3 is an oxide. The trenches may optionally be lined with a liner material, e.g., an oxide. In one embodiment, chemical vapor deposition or another like deposition process may be used to fill the trench with polysilicon or another like STI dielectric material, such as an oxide. A planarization process, such as chemical-mechanical polishing (CMP), may optionally be used to provide a planar structure.

Optionally, a plurality of well regions (not shown) may be located within the substrate 5 and separated by the isolation regions 6. In one embodiment, the well regions correspond to the first and second regions 15, 20, in which the isolation region 6 is present between the first region 15 and the second region 20. In one example, in which the first region 15 is processed to provide at least one n-type field effect transistor (nFET), a first well region is present in the first region 15 doped to a p-type conductivity. In one example, in which the second region 20 is processed to provide at least one p-type field effect transistor (pFET), a second well region is present in the second region 20 doped to an n-type conductivity. Alternatively, the regions 4 are essentially undoped or with a dopant concentration less than $1 \times 10^{17}$ atoms/cm$^3$.

Still referring to FIG. 1, a first gate structure 35 is present in the first region 15 and a second gate structure 40 is present in the second region 20. Each of the first and second gate structures 35, 40 include at least one gate dielectric 39, 43 and at least one gate conductor 37, 42. In one example, the first gate structure 35 comprises a first gate dielectric 39 and a first gate conductor 37. In one example, the second gate structure 40 comprises a second gate dielectric 43 and a second gate conductor 42.

The first and second gate structures 35, 40 may be formed using deposition, photolithography and selective etch processes. A gate layer stack is formed in the first region 15 and second region 20 by depositing at least one gate dielectric layer, i.e., material layers for the first gate dielectric 39 and the second gate dielectric 43, on the substrate 5, and then depositing at least one gate conductor layer, i.e., material layers for the first gate conductor 37 and the second gate conductor 42, on the at least one gate dielectric layer. The gate layer stack is then patterned and etched to provide a first gate structure 35 in the first region 15, and a second gate structure 40 in the second region 20.

Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. In one embodiment, a hard mask (hereafter referred to as a dielectric cap 38) may be used to form the first and second gate structures 35, 40. The dielectric cap 38 may be formed by first depositing a dielectric hard mask material, like SiN or $SiO_2$, atop a layer of gate conductor material and then applying a photoresist pattern to the hard-mask material using a lithography process steps. The photoresist pattern is then transferred into the hard mask material using a dry etch process forming the dielectric cap 38. Next the photoresist pattern is removed and the dielectric cap 38 pattern is transferred into the gate conductor material during a selective etching process. The dielectric cap 38 may be removed by a wet or dry etch prior to the silicidation process.

The first and second gate dielectrics 39, 43 may individually comprise separate dielectric materials such as oxides, nitrides and oxynitrides of silicon that have a dielectric constant ranging from 3.9 to 10.0, as measured in a vacuum at room temperature. Alternatively, one or both of the first and second gate dielectric 39, 43 may be composed of a higher dielectric constant dielectric material having a dielectric constant ranging from 10 to 100. Such higher dielectric constant dielectric materials may include, but are not limited to, hafnium oxides, hafnium silicates, titanium oxides, barium-strontium-titantates (BSTs) and lead-zirconate-titanates (PZTs). The first and second gate dielectrics 39, 43 may be formed using any of several deposition and growth methods, including but not limited to, thermal or plasma oxidation or nitridation methods, chemical vapor deposition methods and physical vapor deposition methods. The first and second gate dielectrics 39, 43 may be composed of the same material or different materials. Although the first and second gate dielectrics 39, 43 are depicted in the supplied figures as each being a single layer, embodiments have been contemplated in which the first and second gate dielectrics 39, 43 are each a multi-layered structure of conductive materials. In one embodiment, the first and second gate dielectrics 39, 43 have a thickness ranging from 10 angstroms to 200 angstroms.

The first and second gate conductors 37, 42 may be composed of conductive materials including, but not limited to, metals, metal alloys, metal nitrides and metal silicides, as well as laminates thereof and composites thereof. In one embodiment, the first and second gate conductors 37, 42 may be any conductive metal including, but not limited to, W, Ni, Ti, Mo, Ta, Cu, Pt, Ag, Au, Ru, Ir, Rh, and Re, and alloys that include at least one of the aforementioned conductive elemental metals. The first and second gate conductors 37, 42 may also comprise doped polysilicon and/or polysilicon-germanium alloy materials (i.e., having a dopant concentration from 1E18 to 1E22 dopant atoms per cubic centimeter) and polycide materials (doped polysilicon/metal silicide stack materials). The first and second gate conductors 37, 42 may be composed of the same material or different materials. The first and second gate conductors 37, 42 may be formed using a deposition method including, but not limited to, salicide methods, atomic layer deposition methods, chemical vapor deposition methods and physical vapor deposition methods, such as, but not limited to, evaporative methods and sputtering methods. Although the first and second gate conductors 37, 42 are depicted in the supplied figures as each being a single layer, embodiments have been contemplated in which the first and second gate conductors 37, 42 are each a multi-layered structure of conductive materials.

The first and second gate structures 35, 40 may further comprise sidewalls spacers 11, 12. The first and second sidewall spacers 11, 12 may be composed of dielectric materials. The first sidewall spacer 11 and the second sidewall spacer 12 are typically formed by using a blanket layer deposition and anisotropic etchback method. In one embodiment, the first sidewall spacer 11 and the second sidewall spacer 12 are composed of silicon oxide and have a thickness ranging from 1 nm to 10 nm.

Figure 2:
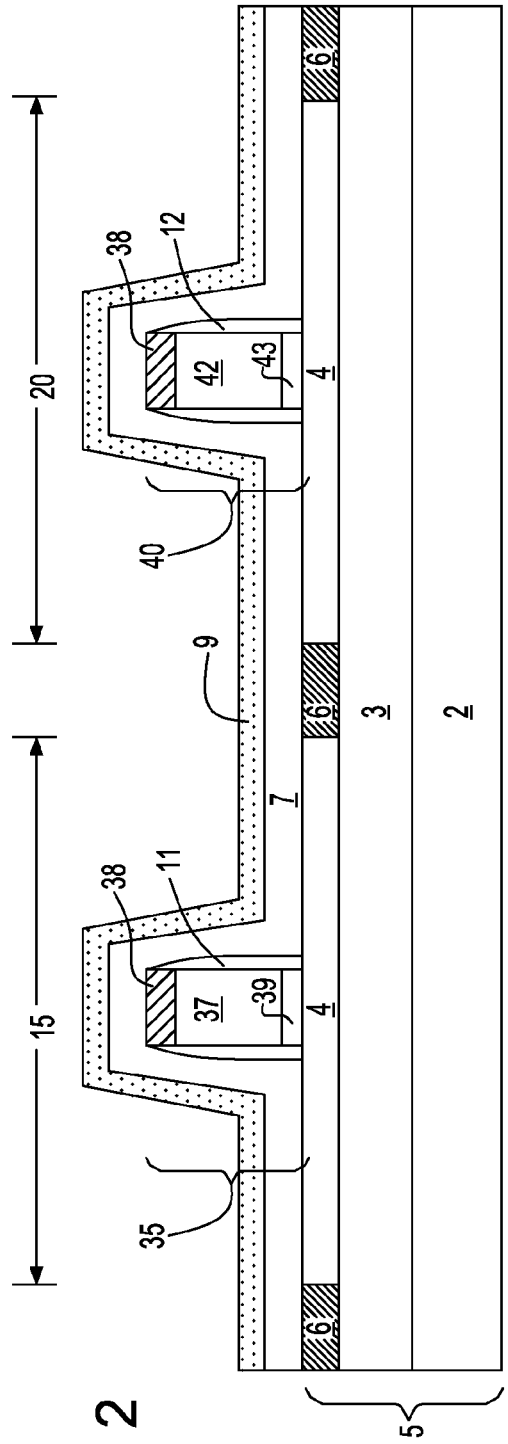
FIG. 2 is a side cross-sectional view of depositing a first material layer doped with the first conductivity type dopant on the first region and the second region of the semiconductor substrate, and forming at least one dielectric layer on the first material layer doped with the first conductivity type dopant, in accordance with one embodiment of the present disclosure.

FIG. 2 depicts one embodiment of depositing a first material layer 7 doped with the first conductivity type dopant on the first region 15 and the second region 20 of the substrate 5. by doped it is meant that the first material layer contains n-type or p-type dopant. In one embodiment, in which the semiconductor device being formed in the first region 15 of the substrate 5 is an p-type semiconductor device, i.e., p-type field effect transistor (pFET), the first conductivity type dopant of the first material layer 7 is a p-type dopant. As used herein, "p-type" refers to the addition of impurities to an intrinsic semiconductor that creates deficiencies of valence electrons. In a silicon-containing substrate, examples of p-type dopants include, but are not limited to, boron, aluminum, gallium and indium. The first material layer 7 may be composed of any material that can carry the first type dopant and is capable of diffusing the first type dopant into the underlying ETSOI layer 4 of the substrate 5. In one embodiment, another critereon for selection of the material of the first material layer 7 is that it is capable of being removed selectively to the underlying ETSOI layer 4. In one embodiment, the first material layer 7 may be composed of a dielectric material, such as an oxide, nitride or oxynitride material. In another embodiment, the first material layer 7 is a semiconductor material, such as polysilicon or single crystal silicon. In one example, the first material layer 7 is composed of a silicate glass, such as a boron doped silicate glass.

In one embodiment, the first material layer 7 is deposited onto the first region 10 and the second region 15 of the substrate 5. The first material layer 7 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Other deposition methods that are suitable for depositing the first material layer 7 include, but are not limited to: spinning from solution, spraying from solution, chemical sputter deposition, reactive sputter deposition, ion-beam deposition, and evaporation. In one embodiment, the first material layer 7 is deposited using a conformal deposition process. The term "conformal" denotes a layer having a thickness that does not deviate from greater than or less than 20% of an average value for the thickness of the layer. The thickness of the first material layer 7 may range from 1 nm to 25 nm. In one embodiment, the thickness of the first material layer 7 ranges from 5 nm to 10 nm.

In one embodiment, the first conductivity type dopant is introduced to the first material layer 7 during the deposition process that forms the first material layer 7. In another embodiment, the first material layer 7 is deposited on the first and second region 15, of the substrate 5, and the first conductivity type dopant is then introduced to the first material layer 7 after its deposition using ion implantation. The concentration of the first conductivity type dopant in the first material layer 7 may range from $1 \times 10^{19}$ atoms/cm$^3$ to $3 \times 10^{22}$ atoms/cm$^3$. In another embodiment, the concentration of the first conductivity type dopant in the first material layer 7 may range from $1 \times 10^{21}$ atoms/cm$^3$ to $1 \times 10^{22}$ atoms/cm$^3$. In yet another embodiment, the concentration of the first conductivity type dopant in the first material layer 7 may range from $2 \times 10^{21}$ atoms/cm$^3$ to $5 \times 10^{21}$ atoms/cm$^3$.

FIG. 2 further depicts forming at least one dielectric layer 9 on the first material layer 7. In one embodiment, the at least one dielectric layer 9 may be formed on the first material layer 7 in both the first region 10 and the second region 20. The at least one dielectric layer 9 may be formed by a thermal growth process such as, for example, oxidation, nitridation or oxynitridation. The at least one dielectric layer 9 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. In one embodiment, the at least one dielectric layer 9 is deposited using a conformal deposition process. The at least one dielectric layer 9 may be composed of any dielectric material that can be etched selectively with respect to the underlying first material layer 7. The at least one dielectric layer 9 may be composed of an oxide, nitride or oxynitride material.

In one embodiment, the at least one dielectric layer 9 employed in the present disclosure includes, but is not limited to, an oxide, nitride, oxynitride and/or silicates including metal silicates, aluminates, titanates and nitrides. In one example, when the at least one dielectric layer 9 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. In another embodiment, the at least one dielectric layer 9 is composed of a nitride, such as silicon nitride. The physical thickness of the at least one dielectric layer 9 may vary, but typically, the at least one dielectric layer 9 has a thickness ranging from 1 nm to 10 nm. In another embodiment, the at least one dielectric layer 9 has a thickness ranging from 1 nm to 3 nm.

FIG. 3 depicts one embodiment of forming a block mask 70 on the at least one dielectric layer 9 in the first region 15, and etching an exposed portion of the at least one dielectric layer 9 and an underlying portion of the first material layer 7 selective to the block mask 70 to expose at least the ETSOI layer 4 in the second region 20 of the substrate 5. In one embodiment, a block mask 70 is formed protecting the portion of the at least one dielectric layer 9 and the first material layer 7 that are present in the first region 15 of the substrate 5 in which p-type semiconductor devices, e.g., pFETs, are subsequently formed. The exposed portion of the at least one dielectric layer 9 and the first material layer 7 that is present in the second region 20 and is not protected by the block mask 70 is subsequently removed.

The block mask 70 may comprise soft and/or hardmask materials and can be formed using deposition, photolithography and etching. In one embodiment, the block mask 70 comprises a photoresist. A photoresist block mask can be produced by applying a photoresist layer to the surface to be etched, exposing the photoresist layer to a pattern of radiation, and then developing the pattern into the photoresist layer utilizing a resist developer.

Alternatively, the block mask 70 can be a hardmask material. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to: silsequioxanes, siloxanes, and boron phosphate silicate glass (BPSG). A block mask 70 comprising a hardmask material may be formed by blanket depositing a layer of hardmask material, providing a patterned photoresist atop the layer of hardmask material, and then etching the layer of hardmask material to provide a block mask 70 protecting the first region 15, in which etching comprises an etch chemistry having a high selectivity to the patterned photoresist and the surface of the second region 20.

FIG. 3 also depicts removing the first material layer 7 and the at least one dielectric layer 9 from the second region 20 of the substrate 5 using a selective etch process. As used herein, the term "selective" in reference to a material removal process denotes that the rate of material removal for a first material is greater than the rate of removal for at least another material of the structure to which the material removal process is being applied. In one embodiment, the selective etch process may include an isotropic etch or an anisotropic etch. An anisotropic etch process is a material removal process in which the etch rate in the direction normal to the surface to be etched is greater than in the direction parallel to the surface to be etched. The anisotropic etch may include reactive-ion etching (RIE). Reactive ion etching (RIE) is a form of plasma etching in which during etching the surface to be etched is placed on the RF powered electrode. Moreover, during RIE the surface to be etched takes on a potential that accelerates the etching species extracted from a plasma toward the surface, in which the chemical etching reaction is taking place in the direction normal to the surface. Other examples of anisotropic etching that can be used at this point of the present invention include ion beam etching, plasma etching or laser ablation. In contrast to anisotropic etching, isotropic etching is a form of etching that does not include a preferential direction. One example of an isotropic etch is wet etching.

In one embodiment, the selective etch process includes a first etch chemistry for removing the exposed portion of the at least one dielectric layer 9 selective to the underlying portion of the first material layer 7 and selective to the block mask 70. A second etch chemistry may then remove the exposed portion of the first material layer 7 selective to the underlying portion of the ETSOI layer 4 and selective to the block mask 70. The second etch chemistry is also selective to the second gate structure 40 and the sidewall spacers 12.

FIG. 4 depicts one embodiment of removing the block mask 70 and depositing the second material layer 8 doped with the second conductivity type dopant in direct contact with a remaining portion of the at least one dielectric layer 9 in the first region 15 and in direct contact with the semiconductor layer, i.e., ETSOI layer 4, in the second region 20 of the substrate 5. The second conductivity type dopant is an opposite conductivity type as the first conductivity type dopant. For example, when the first conductivity type dopant is p-type, the second conductivity type dopant is n-type. The block mask 70 may be removed by selective etch processes, chemical strip methods, oxygen ashing or combinations thereof.

In one embodiment, in which the semiconductor device being formed in the second region 20 of the substrate 5 is an n-type semiconductor device, i.e., n-type field effect transistor (pFET), the second conductivity type dopant of the second material layer 8 is an n-type dopant. As used herein, "n-type" refers to the addition of impurities that contributes free electrons to an intrinsic semiconductor. In a silicon-containing substrate examples of n-type dopants, i.e., impurities, include but are not limited to, antimony, arsenic and phosphorous.

The second material layer 8 may be composed of any material that can carry the second type dopant and is capable of diffusing the second type dopant into the underlying ETSOI layer 4 of the substrate 5. In one embodiment, another criterion for selection of the material of the second material layer 8 is that it is capable of being removed selectively to the underlying ETSOI layer 4. In one embodiment, the second material layer 8 may be composed of a dielectric material, such as an oxide, nitride or oxynitride material. In another embodiment, the second material layer 8 is a semiconductor material, such as polysilicon or single crystal silicon. In one example, the second material layer 8 is composed of a silicate glass, such as a boron doped silicate glass.

In one embodiment, the second material layer 8 is deposited onto the first region 10 and the second region 15 of the substrate 5. The second material layer 8 may be deposited using chemical vapor deposition (CVD) including, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Other deposition methods that are suitable for depositing the second material layer 8 include, but are not limited to: spinning from solution, spraying from solution, chemical sputter deposition, reactive sputter deposition, ion-beam deposition, and evaporation. In one embodiment, the second material layer 8 is deposited using a conformal deposition process. The thickness of the second material layer 8 may range from 1 nm to 25 nm. In one embodiment, the thickness of the second material layer 8 ranges from 5 nm to 10 nm.

In one embodiment, the second conductivity type dopant is introduced to the second material layer 8 during the deposition process that forms the second material layer 8. In another embodiment, the second material layer 8 is deposited on the first and second region 15, 20 of the substrate 5, and the second conductivity type dopant is then introduced to the second material layer 8 after its deposition using ion implantation. The concentration of the second conductivity type dopant in the second material layer 8 may range from $1 \times 10^{19}$ atoms/cm$^3$ to $3 \times 10^{22}$ atoms/cm$^3$. In another embodiment, the concentration of the second conductivity type dopant in the second material layer 8 may range from $1 \times 10^{21}$ atoms/cm$^3$ to $1 \times 10^{22}$ atoms/cm$^3$. In yet another embodiment, the concentration of the second conductivity type dopant in the second material layer 8 may range from $2 \times 10^{21}$ atoms/cm$^3$ to $5 \times 10^{21}$ atoms/cm$^3$.

Figure 5:
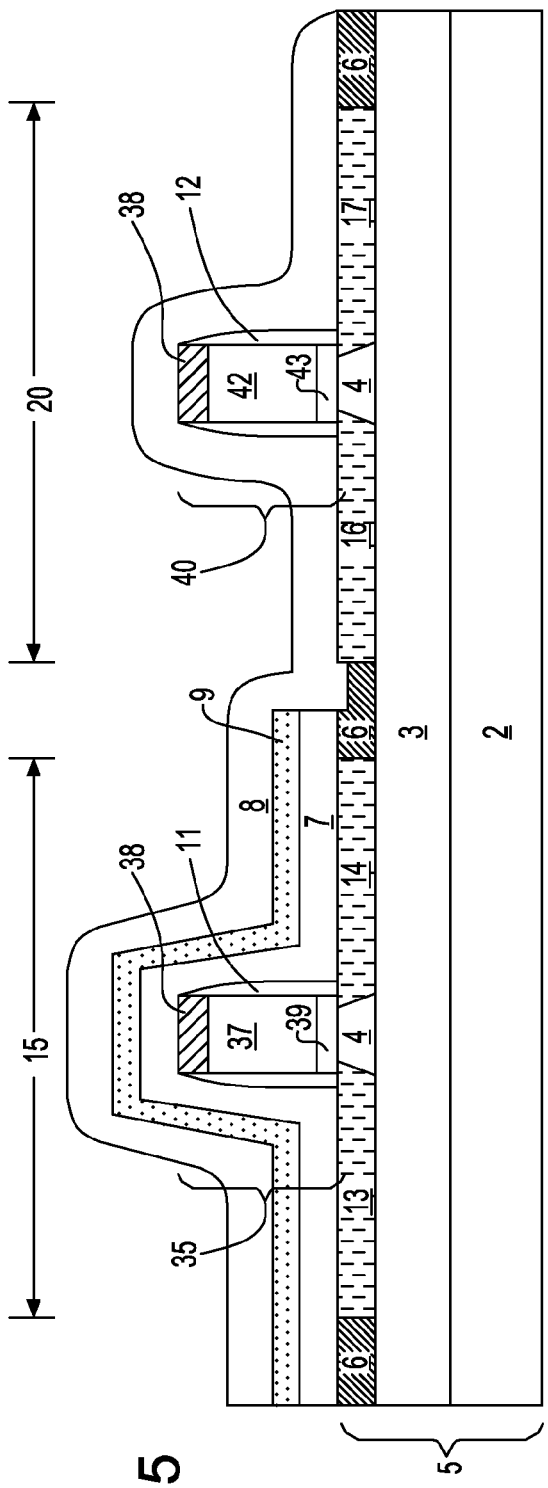
FIG. 5 is a side cross-sectional view depicting driving the first conductivity dopant from the first material layer into the first region of the semiconductor substrate, and driving the second conductivity type dopant from the second material layer into the second region of the semiconductor substrate, in accordance with one embodiment of the present disclosure.

FIG. 5 depicts one embodiment of driving the first conductivity dopant from the first material layer 7 into the first region 15 of the substrate 5, and driving the second conductivity type dopant from the second material layer 8 into the second region 20 of the substrate 5. In one embodiment, the dopant from the first material layer 7 and second material layer 8 is diffused into the ETSOI layer 4 by an annealing processes including, but not limited to, rapid thermal annealing, furnace annealing, flash lamp annealing or laser annealing. In one embodiment, thermal annealing to diffuse the dopant from the second material layer 8 and the first material layer 7 into the underlying ETSOI layer 4 is conducted at a temperature ranging from 850° C. to 1350° C.

In one embodiment, in which the first conductivity type dopant in the first material layer 7 is a p-type dopant, the source extension region 13 and drain extension region 14 that are formed in the ETSOI layer 4 in the first region 15 have a p-type conductivity. Typically, the dopant concentration of the source extension region 13 and drain extension region 14 having the p-type conductivity ranges from $1 \times 10^{19}$ atoms/cm$^3$ to $1 \times 10^{21}$ atoms/cm$^3$. In another embodiment, the source extension region 13 and drain extension region 14 having the p-type conductivity ranges from $4 \times 10^{19}$ atoms/cm$^3$ to $4 \times 10^{20}$ atoms/cm$^3$.

In one embodiment, in which the first conductivity type dopant in the first material layer 7 is doped to an n-type conductivity, the source extension region 16 and drain extension region 17 that are formed in the ETSOI layer 4 in the second region 20 have an n-type conductivity. Typically, the dopant concentration of the source extension region 16 and drain extension region 17 having the n-type conductivity ranges from $1 \times 10^{19}$ atoms/cm$^3$ to $1 \times 10^{21}$ atoms/cm$^3$. In another embodiment, the source extension region 16 and drain extension region 17 having the n-type conductivity ranges from $4 \times 10^{19}$ atoms/cm$^3$ to $4 \times 10^{20}$ atoms/cm$^3$.

Still referring to FIG. 5, the source extension regions 13, 16 and drain extension regions 14, 17 have a depth that typically, but not necessarily always, extend the entire depth of the ETSOI layer 4. Therefore, the source extension regions 13, 16 and the drain extension regions 14, 17 have a depth of less than 10 nm, typically being 3 nm to 8 nm in depth, as measured from the upper surface of the ETSOI layer 4. Following the formation of the source and drain extension regions 13, 16, the first material layer 7, the at least one dielectric layer 9 and the second material layer 8 may be removed using an etch process that removes the material layers selective to the first and second gate structure 35, 40, the ETSOI layer 4 and the isolation regions 6.

Figure 6:
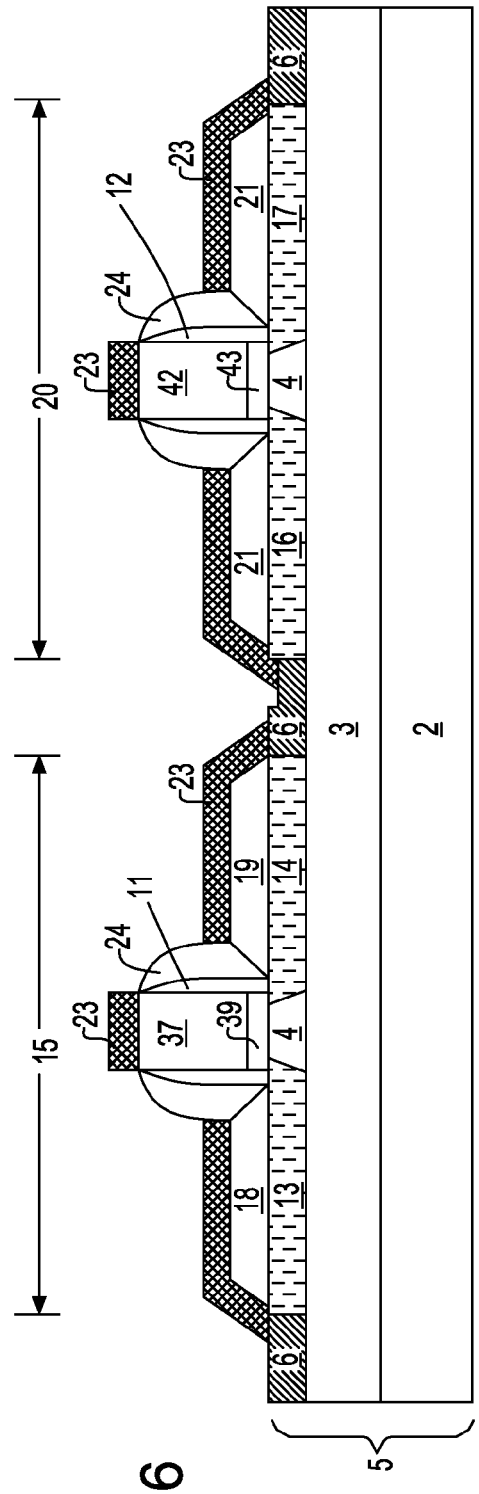
FIG. 6 is a side cross-sectional view depicting forming raised source and drain regions on the upper surface of the semiconductor layer on opposing sides of the gate structure, and forming metal semiconductor alloy regions, in accordance with one embodiment of the present disclosure.

FIG. 6 depicts forming raised source and drain regions in the first region 15 and the second region 20 of the substrate 5. The term "raised" used to describe the raised source and drain regions 18, 19, 21 and 22 mean that the semiconductor material of these portions of the semiconductor device have an upper surface that is vertically offset and above the upper surface of the ETSOI layer 4, in the channel region of the device is present. In one embodiment, the raised source regions 18, 21 and the raised drain regions 19, 22 are formed on an upper surface the semiconductor layer, i.e., ETSOI layer 4, that contains the source and drain extension regions 13, 14, 16, 17, wherein the raised source regions 18, 21 and the raised drain regions 19, 22 are on opposing sides of the first and second gate structure 35, 40.

In one embodiment, the raised source and drain regions 18, 19, 21 and 22 is composed of an epitaxially formed material, and has a thickness ranging from 5 nm to 80 nm, as measured from the upper surface of the ETSOI layer 4. In another embodiment, each of the raised source and drain regions 18, 19, 21, 22 has a thickness ranging from 10 nm to 50 nm, as measured from the upper surface of the ETSOI layer 4. In yet another embodiment, the raised source and drain regions 18, 19, 21, 22 have a thickness ranging from 10 nm to 20 nm, as measured from the upper surface of the ETSOI layer 4. In a yet further embodiment, the thickness of the raised source and drain regions 18, 19, 21, 22 is substantially equal to the thickness of the ETSOI layer 4.

The raised source and drain regions 18, 19, 21, 22 may be selectively formed in direct contact with the ETSOI layer 4. The raised source and drain regions 18, 19, 21, 22 can be formed using an epitaxial growth process. As used herein, the terms "epitaxially formed", "epitaxial growth" and/or "epitaxial deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the surface of the ETSOI layer 4 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon.

The raised source and drain regions 18, 19, 21, 22 may be provided by selective growth of silicon. The silicon may be single crystal, polycrystalline or amorphous. The raised source and drain regions 18, 19, 21, 22 may be epitaxial silicon. The raised source and drain regions 18, 19, 21, 22 may also be provided by selective growth of germanium. The germanium may be single crystal, polycrystalline or amorphous. In another example, the raised source and drain regions 18, 19, 21, 22 may be composed of SiGe.

A number of different sources may be used for the selective deposition of silicon. Silicon sources for growth of silicon (epitaxial or poly-crystalline) include silicon tetrachloride, dichlorosilane (SiH$_2$Cl$_2$), and silane (SiH$_4$). The temperature for epitaxial silicon deposition typically ranges from 550° C. to 900° C. Higher temperature typically results in faster deposition; the faster deposition may result in crystal defects and film cracking. In one embodiment, the raised source and drain regions 18, 19, 21, 22 each have a tapered portion that extends from the first and second sidewall spacers 11, 12. More specifically, in this embodiment, the thickness of the tapered portion of the raised source and drain regions 18, 19, 21, 22 increases in the lateral direction away from the first and second sidewall spacers 11, 12. Following the taper portion, the upper surface of the raised source and drain regions 18, 19, 21, 22 is substantially parallel to the upper surface of the ETSOI layer 4. In one embodiment, another set of spacers 24 is formed adjacent to the first and second sidewall spacers 11, 12 prior to forming the raised source and drain regions 18, 19, 21, 22.

The raised source and drain regions 18, 19, 21, 22 are doped with a dopant having a same conductivity as the underlying source extension regions 13, 16 and the underlying drain extension regions 14, 17. For example, and in the embodiments in which the source extension regions 13 and drain extension regions 14 that are present in the first region 15 are doped to a p-type conductivity, the raised source regions 18 and the raised drain regions 19 that are present in the first region 15 are doped to a p-type conductivity. In the embodiments in which the source extension regions 16 and the drain extension regions 17 that are present in the second region 20 are doped to an n-type conductivity, the raised source regions 21 and the raised drain regions 22 that are present in the second region 20 are doped to an n-type conductivity. The dopant may be introduced in-situ during the epitaxial growth process that forms the raised source and drain regions 18, 19, 21, 22. In another embodiment, the dopant may be introduced using ion implantations following the epitaxial growth process that deposits the semiconductor material of the raised source and drain regions 18, 19, 21, 22. Resulting dopant concentrations for the raised source and drain regions 18, 19, 21, 22 may range from $2 \times 10^{19}$ dopant atoms per cubic centimeter to $5 \times 10^{21}$ dopant atoms per cubic centimeter.

FIG. 6 further depicts forming metal semiconductor alloy regions 23 on an upper surface of the raised source and drain regions 18, 19, 21, 22. In one embodiment, the metal semiconductor alloy 23 is a silicide. Silicide formation typically requires depositing a refractory metal such as Ni or Ti onto the surface of a Si-containing material. Following deposition, the structure is then subjected to an annealing step using conventional processes such as, but not limited to, rapid thermal annealing. During thermal annealing, the deposited metal reacts with Si forming a metal silicide.

FIG. 6 depicts one embodiment of a semiconductor device that may be formed using the above-described method. A p-type semiconductor device, such as a p-type field effect transistor, may be formed in the first region 15 of the substrate 5, and an n-type semiconductor device, such as an n-type field effect transistor, may be formed in the second region 20 of the substrate 5. Each of the semiconductor devices may include a gate structure, i.e., first and second gate structures 35, 40, on a first portion of a semiconductor layer, i.e., ETSOI layer 4, having a thickness of less than 10 nm. In one embodiment, the source and drain regions, i.e., source extension regions 13, 16 and drain extension regions 14, 17, are present in the ETSOI layer 4 on opposing sides of the first portion of the semiconductor layer that the gate structure is present on. The source extension regions 13, 16 and the drain extension regions 14, 17 may extend to an entire thickness of the ETSOI layer 4. The crystal structure of the source extension regions 13, 16 and the drain extension regions 14, 17 in the semiconductor layer are damage-free. The term "damage-free" with reference to the source extension regions 13, 16 and the drain extension region 14, 17 that are present in the ETSOI layer 4 means that a single crystal lattice structure is present from the upper surface of the ETSOI layer 4 to the base of the ETSOI layer 4 that is in contact with the buried insulating layer 3. In contrast to a damage-free crystal structure, source and drain extension regions that are formed in an ETSOI layer by ion implantation have a damaged region that may be present through at least a portion of the thickness of the ETSOI layer. The damaged region disrupts the long range order of the crystalline structure of the single crystal lattice structure, i.e., the order and pattern in which the atoms of the material of the ETSOI layer are arranged.

Although, the above examples depict a complementary metal oxide semiconductor (CMOS) device, i.e., a semiconductor device including both p-type and n-type semiconductor devices, the first and second regions 15, 20 of the substrate 5 may include semiconductor devices of the same conductivity type.

Although, the above examples are depicted using an ETSOI substrate, the above method is also applicable to semiconductor devices formed on a thick SOI substrate (not shown) or a bulk-semiconductor substrate 50, as depicted in FIGS. 8 and 9. The term of "thick SOI substrate" refers to an SOI substrate that has an SOI thickness greater than 10 nm. The bulk-semiconductor substrate 50 may be a silicon-containing material. Illustrative examples of Si-containing materials suitable for the bulk-semiconductor substrate include, but are not limited to, Si, SiGe, SiGeC, SiC, polysilicon, i.e., polySi, epitaxial silicon, i.e., epi-Si, amorphous Si, i.e., α:Si, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

Figure 7:
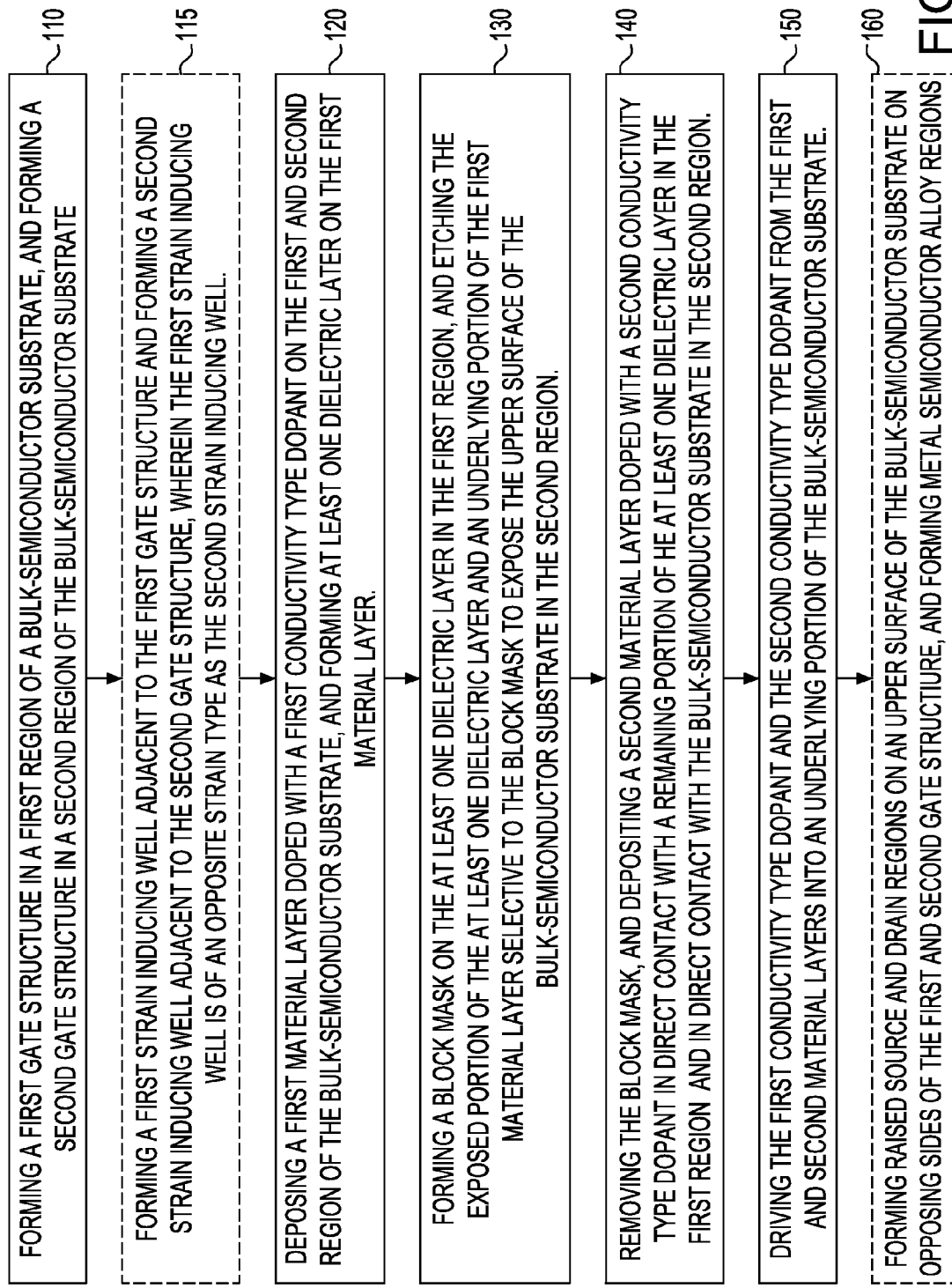
FIG. 7 is a flow chart illustrating the process of another embodiment of a method in accordance with the present disclosure, in which the substrate is a bulk-semiconductor substrate.

A process flow for forming a semiconductor device using a bulk-semiconductor substrate 50 is illustrated in FIG. 7. It is noted that the process flow depicted in FIG. 7 is for illustrative purposes only, and that intermediate process steps that are not illustrated in FIG. 7 may be further incorporated into the process flow. Referring to FIGS. 7, 8 and 9, step 110 includes forming a first gate structure 35 in a first region 15 of a bulk semiconductor substrate 50 and a second gate structure 40 in a second region of the bulk semiconductor substrate 50. It is noted that the details of this process step have been described above with reference to FIG. 1, with the exception that the substrate is a bulk-semiconductor substrate 50 instead of an ETSOI substrate.

Referring to FIGS. 7 and 9, in one embodiment, step 115 includes forming strain inducing wells 55, 60 on opposing sides of the first and second gate structure 35, 40. In one embodiment, tensile stress inducing wells 55 are positioned adjacent to the second gate structure 40 to an n-type semiconductor device, such as an n-type field effect transistor (nFET). The tensile stress inducing wells 55 may include silicon doped with carbon (Si:C) or silicon germanium doped with carbon (SiGe:C). The tensile stress inducing wells 55 comprise intrinsically tensile Si:C can be epitaxially grown atop a recessed portion of the bulk-semiconductor substrate 50. The term "intrinsically tensile Si:C" denotes that the Si:C is under an internal tensile stress, in which the tensile stress is produced by a lattice mismatch between the smaller lattice dimension of the Si:C and the larger lattice dimension of the layer on which the Si:C is epitaxially grown. The tensile stress inducing wells produce a tensile stress within the device channel to the n-type semiconductor device that is present in the second region 20 of the bulk-semiconductor substrate 50. The carbon (C) content of the epitaxial grown Si:C ranges from 0.3% to 10%, by atomic weight %. In another embodiment, the carbon (C) content of the epitaxial grown Si:C may range from 1% to 2%.

In one embodiment, compressive stress inducing wells 60 are positioned adjacent the first gate structure 35 in the first region 15 of the bulk-semiconductor substrate 50. Compressive stress inducing wells 60 that are formed of intrinsically compressive SiGe can be epitaxially grown atop a recessed portion of the bulk-semiconductor substrate 50. The term "intrinsically compressive layer" denotes that the SiGe is under an intrinsic compressive stress (also referred to as an intrinsic compressive stress), in which the compressive stress is produced by a lattice mismatch between the larger lattice dimension of the SiGe and the smaller lattice dimension of the layer on which the SiGe is epitaxially grown. The compressive stress inducing wells 60 produce a compressive stress in the device channel. The Ge content of the epitaxial grown SiGe may range from 5% to 80%, by atomic weight %. In another embodiment, the Ge content of the epitaxial grown SiGe may range from 10% to 50%. Step 115 is an optional step that is employed in a process sequence to provide the final structure depicted in FIG. 9. Step 115 may be omitted in a process sequence to provide the final structure depicted in FIG. 8.

Referring to FIGS. 7, 8 and 9, step 120 includes depositing a first material layer doped with a first conductivity type dopant on the first and second region 15, 20 of the bulk-semiconductor substrate 50, and depositing at least one dielectric layer on the first material layer. It is noted that the details of this process step have been described above with reference to FIG. 2, with the exception that the substrate is a bulk-semiconductor substrate 50 instead of an ETSOI substrate.

Referring to FIGS. 7, 8 and 9, step 130 includes forming a block mask 70 on the at least one dielectric layer in the first region 15, and etching the exposed portion of the at least one dielectric layer and the underlying portion of the first material layer. It is noted that the details of this process step have been described above with reference to FIG. 3, with the exception that the substrate is a bulk-semiconductor substrate 50 instead of an ETSOI substrate.

Referring to FIGS. 7, 8 and 9, step 140 includes removing the block mask 70, and depositing a second material layer 8 doped with a second conductivity type dopant in direct contact with a remaining portion of the at least one dielectric layer 9 in the first region 15, and in direct contact with the bulk-semiconductor 50 in the second region 20. It is noted that the details of this process step have been described above with reference to FIG. 4, with the exception that the substrate is a bulk-semiconductor substrate 50 instead of an ETSOI substrate.

Referring to FIGS. 7, 8 and 9, step 150 includes driving the first conductivity type dopant and the second conductivity type dopant from the first and second material layer 7, 8 into the bulk semiconductor substrate 50 to provide the source extension regions 13, 16 and drain extension regions 14, 17. The source extension regions 13, 16 and drain extension regions 14, 17 extend to a depth of 10 nm or less, as measured from the upper surface of the bulk-semiconductor substrate 50. It is noted that the details of this process step have been described above with reference to FIG. 5, with the exception that the substrate is a bulk-semiconductor substrate 50 instead of an ETSOI substrate. Following the formation of the source and drain extension regions 13, 14, 16, 17, the first material layer 7, the at least one dielectric layer 9 and the second material layer 8 may be removed using an etch process that removes the material layers selective to the first and second gate structure 35, 40, the ETSOI layer 4 and the isolation regions 6.

Referring to FIG. 7, step 160 includes forming raised source and drain regions on an upper surface of the bulk-semiconductor substrate 50 on opposing sides of the first and second gate structures 35, 40, and forming metal semiconductor alloy regions. It is noted that the details of this process step have been described above with reference to FIG. 6, with the exception that the substrate is a bulk-semiconductor substrate 50. It is noted that step 160 is optional.

FIGS. 8 and 9 depict some embodiments of a semiconductor device formed on a bulk-semiconductor semiconductor substrate 50 using the present method. Similar to the semiconductor device depicted in FIG. 6, the crystal structure of the source extension regions 13, 16 and drain extension regions 14, 17 that are formed in the bulk semiconductor substrate 50 is damage-free. The term "damage-free" means that the single crystal lattice structure of the source and drain extension regions 13, 16, 14, 17 is substantially the same as the single crystal lattice structure of the base material of the bulk semiconductor substrate 50 in which the source and drain extension regions 13, 16, 14, 17 are not present.

In another embodiment, a finFET semiconductor device is formed by a method that employs at least one material layer carrying a dopant to introduce the dopant to the source and drain regions of the device without ion implantation. A fin-FET is a semiconductor device that includes a fin structure. The fin structure is the body of a semiconductor device, in which the gate structure is positioned around the fin structure such that charge flows down the channel on the two sidewalls of the fin structure and optionally along the top surface of the fin structure. In some embodiments, a material layer carrying an n-type or p-type dopant is utilized to introduce the dopant for the source and drain extension regions into the fin structure.

FIGS. 10-16 depict one embodiment of a method of fabricating a finFET semiconductor device having a fin structure 200 with a width W1 of less than 10 nm, in which the method does not use ion implantation to provide the source and drain extension regions in the fin structure of the device. FinFET formation typically requires ion implantation to form source and drain extension regions. Ion implantation typically tends to amorphize the entire fin structure and generates implant-related defects. It is difficult to recrystallize the amorphous semiconductor and to eliminate implant defects during the subsequent low thermal budget anneal process that are typically utilized in finFET manufacturing. In one embodiment, the method disclosed herein overcomes the disadvantages that result from ion implantation by forming the source and drain extension regions in the fin structure using an dielectric material layer carrying the dopant for the extension source and drain regions followed by an annealing process, wherein the annealing process drives the dopant from the doped dielectric material layer into the fin structure to form extension source and drain regions.

Figure 10:
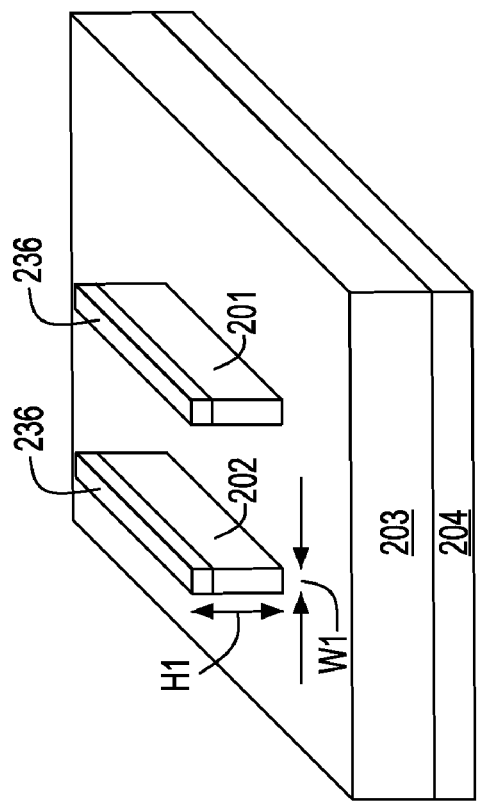
FIG. 10 is a perspective view depicting an initial structure including a first fin structure and a second fin structure, as used in one embodiment of a method for forming a finFET device.

FIG. 10 depicts an initial structure used in one embodiment of a method for forming a finFET device. The initial structure may include a first fin structure 201 in a first region of the substrate, and a second fin structure 202 in a second region of the substrate. The first fin structure 201 that is present in the first region of the substrate may be subsequently processed to provide a p-type finFET. The second fin structure 202 that is present in the second region of the substrate may be subsequently processed to provide an n-type finFET. The first and second fin structures 201, 202 may be present atop a dielectric layer 203. In one embodiment, a dielectric fin cap 236 may be present on each of the first fin structure 201 and the second fin structure 202. In one embodiment, the fin structures 201, 202 and the dielectric layer 203 may be provided from an SOI substrate, in which the top semiconductor layer of the SOI substrate provides the first and second fin structure 201, 202. The SOI substrate typically includes a bottom semiconductor layer 204 and a top semiconductor layer (hereafter referred to as an SOI layer) that are electrically isolated from each other by a buried insulating layer (hereafter referred to as a dielectric layer 204). The SOI layer and the bottom semiconductor layer 204 may comprise at least one of Si, Ge alloys, SiGe, GaAs, InAs, InP, SiCGe, SiC as well as other III/V or II/VI compound semiconductors. The SOI layer and bottom semiconductor layer 204 may comprise the same or different materials.

The dielectric layer 203 separating the SOI layer 200 and the bottom semiconductor layer 100 may be a crystalline or non-crystalline oxide, nitride, oxynitride, or any other insulating material. The SOI substrate employed in the present invention may be formed utilizing a layer transfer process including a bonding step. Alternatively, an implantation process such as SIMOX (Separation by IMplantation of OXygen) can be used in forming the SOI substrate.

The thickness of the various layers of the SOI substrate may vary depending on the technique used in forming the same. In one embodiment, the SOI layer has a thickness ranging from 3 nm to 100 nm, the dielectric layer 203 (also referred to as buried dielectric layer) has a thickness ranging from 10 nm to 150 nm, and the thickness of the bottom semiconductor layer 204 of the SOI substrate may range from 10 nm to 500 nm.

It is noted that although an SOI substrate is depicted and described in the following discussion, embodiments of the present invention are contemplated that utilize a bulk semiconductor substrate. In one example of the present invention, in which a bulk semiconductor substrate is used, the bulk semiconductor substrate comprises at least one of Si, Ge alloys, SiGe, GaAs, InAs, InP, SiCGe, SiC as well as other III/V or II/VI compound semiconductors.

In one embodiment, prior to etching the SOI substrate to provide the first and second fin structures 201, 202, a layer of the dielectric material that provides the dielectric fin cap 236 is deposited atop the SOI substrate. The dielectric fin cap 236 may be composed of a nitride, oxide, oxynitride material, and/or any other suitable dielectric layer. The dielectric fin cap 236 may comprise a single layer of dielectric material or multiple layers of dielectric materials. The dielectric layer can be formed by a deposition process, such as chemical vapor deposition (CVD) and/or atomic layer deposition (ALD). Alternatively, the dielectric fin cap 236 may be formed using a growth process, such as thermal oxidation or thermal nitridation. The dielectric fin cap 236 may have a thickness ranging from 1 nm to 100 nm. In one embodiment, the dielectric fin cap 236 is composed of an oxide, such as $SiO_2$, that is formed by chemical vapor deposition to a thickness on the order of 25 nm to 50 nm.

In one embodiment, following the formation of the layer of dielectric material that provides the dielectric fin cap 236, a photolithography and etch process sequence applied to the dielectric fin cap 236 and the SOI substrate may provide the initial structure that is depicted in FIG. 5. Specifically, and in one example, a photoresist mask is formed overlying the layer of the dielectric material that provides dielectric fin cap 236 and is present overlying the SOI layer of the substrate, in which the portion of the dielectric material that is underlying the photoresist mask provides the dielectric fin cap 236, and the portion of the SOI layer that is underlying the photoresist mask provides the first and second fin structures 201, 202. The exposed portions of the dielectric material and the SOI substrate, which are not protected by the photoresist mask, are removed using a selective etch process. To provide the photoresist mask, a photoresist layer is first positioned on the layer of the dielectric material that provides dielectric fin cap 236. The photoresist layer may be provided by a blanket layer of photoresist material that is formed utilizing a deposition process such as, for example, CVD, PECVD, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the dielectric fin cap 236 followed by removing the unprotected portion of the SOI layer selective to the underlying buried insulating layer, i.e., dielectric layer 203. For example, the transferring of the pattern provided by the photoresist into the underlying structures may include an anisotropic etch. The anisotropic etch may include reactive-ion etching (RIE). Other examples of anisotropic etching that can be used at this point of the present invention include ion beam etching, plasma etching or laser ablation.

Each of the first and second fin structures 201, 202 may have a height $H_1$ ranging from 5 nm to 200 nm. In one embodiment, each of the first and second fin structures 201, 202 have a height $H_1$ ranging from 10 nm to 100 nm. In another embodiment, each of the first and second fin structures 201, 202 have a height $H_1$ ranging from 20 nm to 50 nm. In one embodiment, the first and second fin structures 201, 202 each have a width $W_1$ of less than 10 nm. In another embodiment, the first and second fin structures 201, 202 each have a width $W_1$ ranging from 3 nm to 8 nm.

Figure 11:
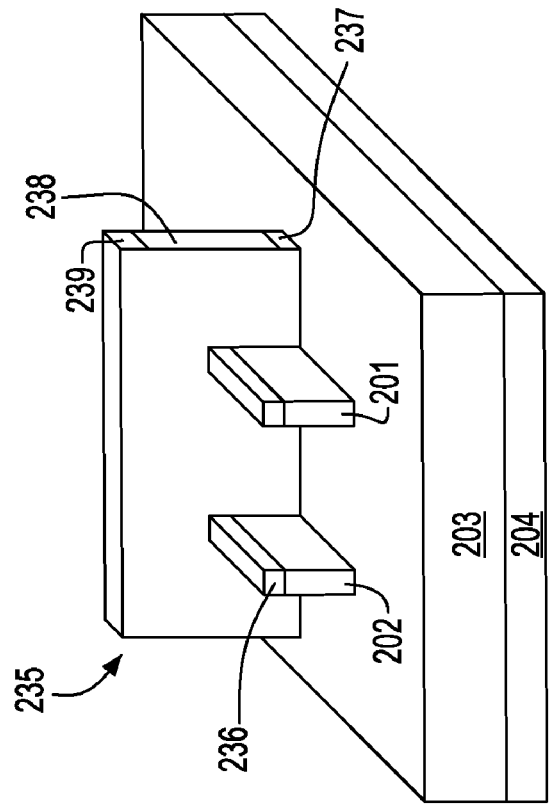
FIG. 11 is a perspective view depicting forming a first gate structure on a first fin structure and a second gate structure on a second fin structure, in accordance with one embodiment of the present disclosure.

FIG. 11 depicts forming a gate structure 235 on the first and second fin structures 201, 202, and the dielectric fin cap 236. In one embodiment, the gate structure 235 includes a gate dielectric 237 in contact with at least the first and second fin structures 201, 202, a gate conductor 238 on the gate dielectric 237, and a gate dielectric cap 239 the gate conductor 238. The gate structure 235 may be formed by forming blanket material layers for the gate dielectric 237, gate conductor 238, and gate dielectric cap 239 to provide a gate stack, and patterning and etching the gate stack to provide the gate structure 235. The patterned gate region 235 is formed utilizing photolithography and etch process steps.

The gate dielectric 237 is typically positioned on at least a portion of the sidewalls of the first and second fin structures 201, 202. The gate dielectric 237 may be formed by a thermal growth process such as, for example, oxidation, nitridation or oxynitridation. The gate dielectric 237 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. In one embodiment, the gate dielectric 90 is deposited using a conformal deposition process.

The gate dielectric 237 may be comprised of an insulating material having a dielectric constant of 4.0 or greater. In another embodiment, the gate dielectric 237 is comprised of an insulating material having a dielectric constant greater than 7.0. The dielectric constants mentioned herein are relative to a vacuum at room temperature. In one embodiment, the gate dielectric 237 employed in the present invention includes, but is not limited to: an oxide, nitride, oxynitride and/or silicates including metal silicates, aluminates, titanates and nitrides. In one example, when the gate dielectric 237 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric 237 may vary, but typically, the gate dielectric 237 has a thickness ranging from 1 nm to 10 nm. In another embodiment, the gate dielectric 237 has a thickness ranging from 1 nm to 3 nm.

After forming the gate dielectric 237, the gate conductor 238 of the gate structure 235 is formed on the gate dielectric 237 utilizing a deposition process, such as physical vapor deposition (PVD), CVD or evaporation. The gate conductor 238 may be composed of polysilicon, SiGe, a silicide, a metal or a metal-silicon-nitride, such as Ta—Si—N. Examples of metals that can be used as the gate conductor 80 include, but are not limited to: Al, W, Cu, Ti or other like conductive metals. In one embodiment, the gate conductor 238 comprises Ti, Zr, Hf, V, Nb, Ta, TiN, TaN or a combination thereof. The gate conductor 238 may be doped or undoped. The physical thickness of the gate conductor 238 may range from 1 nm to 10 nm. In another embodiment, the gate conductor 238 has a thickness ranging from 1 nm to 3 nm.

The gate dielectric cap 239 may be composed of a nitride, oxide, oxynitride material, and/or any other suitable dielectric layer. The gate dielectric cap 239 may comprise a single layer of dielectric material or multiple layers of dielectric materials. The dielectric layer can be formed by a deposition process, such as chemical vapor deposition (CVD) and/or atomic layer deposition (ALD). Alternatively, the gate dielectric cap 239 may be formed using a growth process, such as thermal oxidation or thermal nitridation. The gate dielectric cap 239 may have a thickness ranging from 1 nm to 100 nm. In one embodiment, the gate dielectric cap 239 is composed of a nitride, such as SiN, that is formed by chemical vapor deposition to a thickness on the order of 25 nm to 50 nm.

Figure 12:
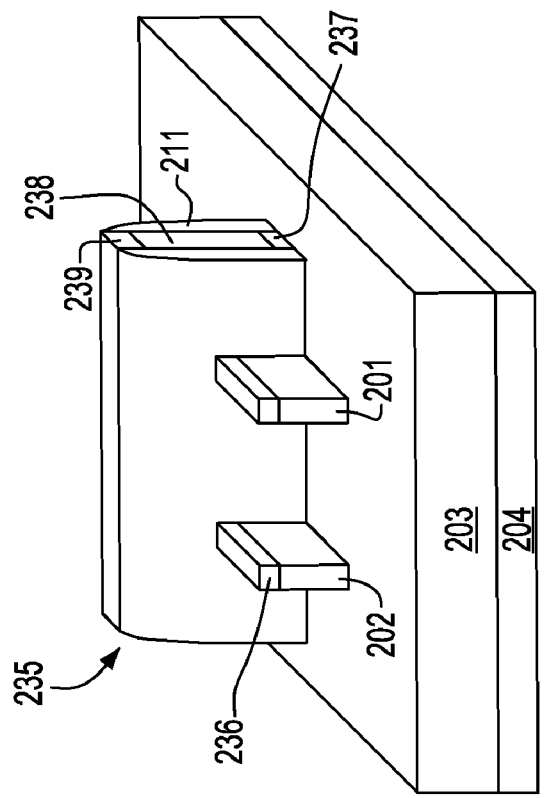
FIG. 12 is a perspective view depicting forming a first spacer in direct contact with the first and second gate structures, in accordance with one embodiment of the present disclosure.

FIG. 12 depicts forming a first spacer 211 in direct contact with the gate structure 235. The first spacer 211 may be formed by depositing a conformal layer of dielectric material, such as oxides, nitrides or oxynitrides, and then etching the deposited layer. In one embodiment, the etching process is an anisotropic etching process, such as reactive ion etch. The first spacer 211 may have a width ranging from 1 nm to 10 nm, typically ranging from 1 nm to 5 nm.

Figure 13:
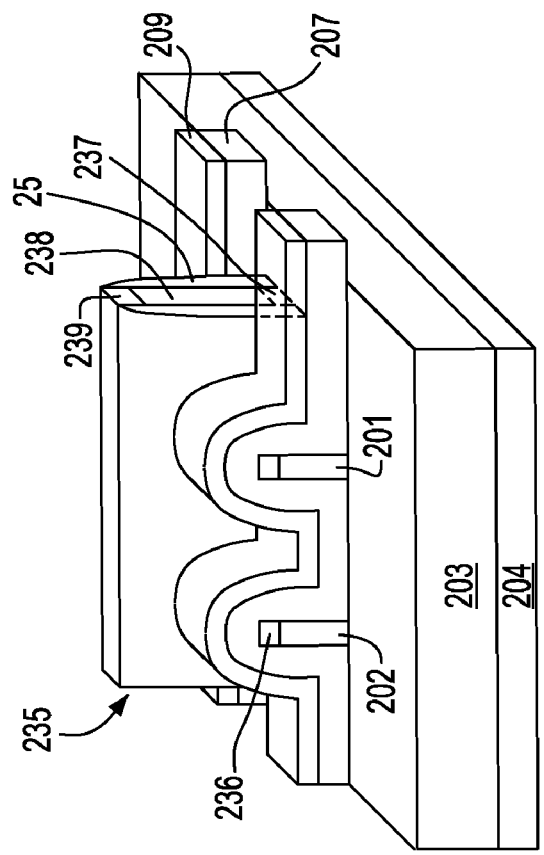
FIG. 13 is a perspective view of depositing a first material layer doped with the first conductivity type dopant on the first region and the second region of the substrate, and forming at least one dielectric layer on the first material layer doped with the first conductivity type dopant in the first region and the second region, in accordance with one embodiment of the present disclosure.

FIG. 13 depicts one embodiment of depositing a first material layer 207 doped with the first conductivity type dopant on the first region and the second region of the substrate, and forming at least one dielectric layer 208 on the first material layer 207. In one embodiment, at least a portion of the first material layer 207 is in direct contact with the exposed portions of the first and second fin structures 201, 202.

In one embodiment, in which the semiconductor device being formed in the first region of the substrate is a p-type finFET, the first conductivity type dopant of the first material layer 207 is a p-type dopant. The first material layer 207 may be composed of any material that can carry the first type dopant and is capable of diffusing the first type dopant into the underlying first fin structure 201. In one embodiment, another critereon for selection of the material of the first material layer 207 is that it is capable of being removed selectively to the underlying first and second fin structures 201, 202. In another embodiment, the first material layer 207 may be composed of a dielectric material, such as an oxide, nitride or oxynitride material. In one example, the first material layer 207 is composed of a silicate glass, such as an boron doped silicate glass.

In one embodiment, the first material layer 207 is deposited onto the first region and the second region of the substrate. The first material layer 207 may be deposited using chemical vapor deposition (CVD). Variations of CVD processes that are suitable for depositing the first material layer 207 include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Other deposition methods that are suitable for depositing the first material layer 207 include, but are not limited to: spinning from solution, spraying from solution, chemical sputter deposition, reactive sputter deposition, ion-beam deposition, and evaporation. In one embodiment, the first material layer 207 is deposited using a conformal deposition process. The thickness of the first material layer 7 may range from 1 nm to 25 nm. In one embodiment, the thickness of the first material layer 7 ranges from 5 nm to 10 nm.

In one embodiment, the first conductivity type dopant is introduced to the first material layer 207 during the deposition process that forms the first material layer 207. In another embodiment, the first material layer 207 is deposited on the first and second region of the substrate, and the first conductivity type dopant is then introduced to the first material layer 207 after its deposition using ion implantation. The concentration of the first conductivity type dopant in the first material layer 207 may range from $1 \times 10^{19}$ atoms/cm$^3$ to $3 \times 10^{22}$ atoms/cm$^3$. In another embodiment, the concentration of the first conductivity type dopant in the first material layer 207 may range from $1 \times 10^{21}$ atoms/cm$^3$ to $1 \times 10^{22}$ atoms/cm$^3$. In yet another embodiment, the concentration of the first conductivity type dopant in the first material layer 207 may range from $2 \times 10^{21}$ atoms/cm$^3$ to $5 \times 10^{21}$ atoms/cm$^3$.

FIG. 13 further depicts forming at least one dielectric layer 209 on the first material layer 207. In one embodiment, the at least one dielectric layer 209 may be formed on the first material layer 207 in both the first region and the second region. The at least one dielectric layer 209 may be formed by a thermal growth process such as, for example, oxidation, nitridation or oxynitridation. The at least one dielectric layer 209 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. In one embodiment, the at least one dielectric layer 209 is deposited using a conformal deposition process. The at least one dielectric layer 209 may be composed of any dielectric material that can be etched selectively with respect to the underlying first material layer 207. The at least one dielectric layer 209 may be composed of an oxide, nitride or oxynitride material.

In one embodiment, the at least one dielectric layer 209 employed in the present disclosure includes, but is not limited to: an oxide, nitride, oxynitride and/or silicates including metal silicates, aluminates, titanates and nitrides. In one example, when the at least one dielectric layer 9 is comprised of an oxide, the oxide may be selected from the group including, but not limited to: $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. In another embodiment, the at least one dielectric layer 209 is composed of a nitride, such as silicon nitride. The physical thickness of the at least one dielectric layer 209 may vary, but typically, the at least one dielectric layer 209 has a thickness from 1 nm to 10 nm. In another embodiment, the at least one dielectric layer 209 has a thickness from 1 nm to 3 nm.

Figure 14:
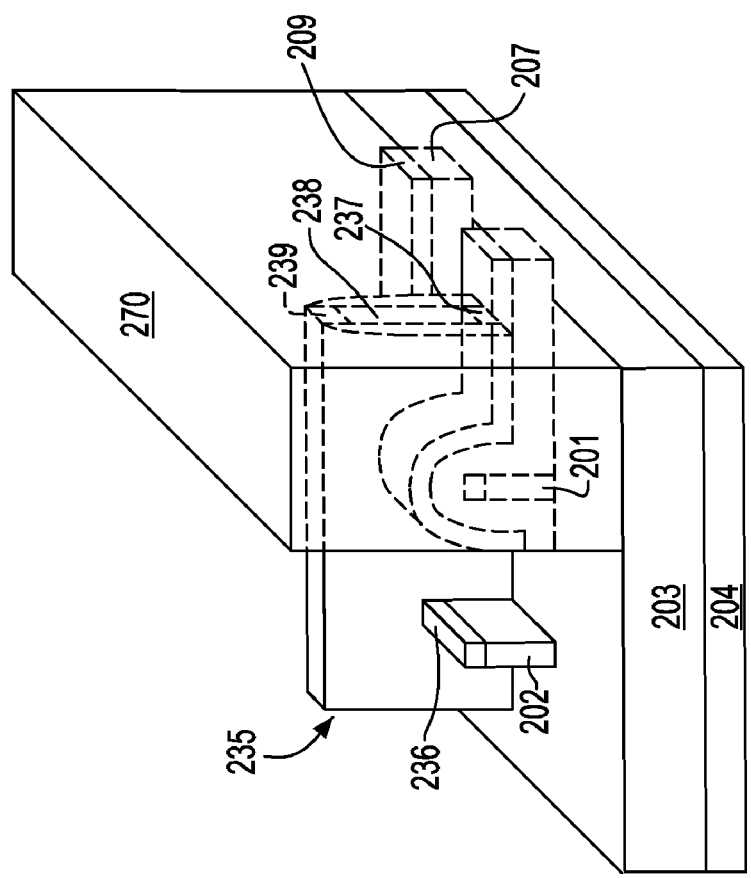
FIG. 14 is a perspective view of forming a block mask on the at least one dielectric layer, and etching an exposed portion of the at least one dielectric layer and an underlying portion of the first material layer selective to the block mask to expose at least the second fin structure in the second region of the substrate, in accordance with one embodiment of the present disclosure.

FIG. 14 depicts one embodiment of forming a block mask 270 on the at least one dielectric layer 209 in the first region, and etching an exposed portion of the at least one dielectric layer 209 and an underlying portion of the first material layer 207 selective to the block mask 270 to expose at least the second fin structure 202 and the fin cap dielectric 236 that is overlying the second fin structure 202 in the second region of the substrate. In one embodiment, a block mask 270 is formed protecting the portion of the at least one dielectric layer 209 and the first material layer 207 that are present in the first region of the substrate in which p-type semiconductor devices, e.g., pFETs, are subsequently formed. The exposed portion of the at least one dielectric layer 209 and the first material layer 207 that is present in the second region and is not protected by the block mask 270 is removed.

The block mask 270 may comprise soft and/or hardmask materials and can be formed using deposition, photolithography and etching. In one embodiment, the block mask 270 comprises a photoresist. A photoresist block mask 270 can be produced by applying a photoresist layer to the surface of the substrate, exposing the photoresist layer to a pattern of radiation, and then developing the pattern into the photoresist layer utilizing a resist developer.

In one embodiment, a selective etch process of a first etch chemistry removes the exposed portion of the at least one dielectric layer 209 selective to the underlying portion of the first material layer 207 and selective to the block mask 270. A second etch chemistry may then remove the exposed portion of the first material layer 207 selective to the fin cap dielectric 236 that is overlying the second fin structure 202.

Figure 15:
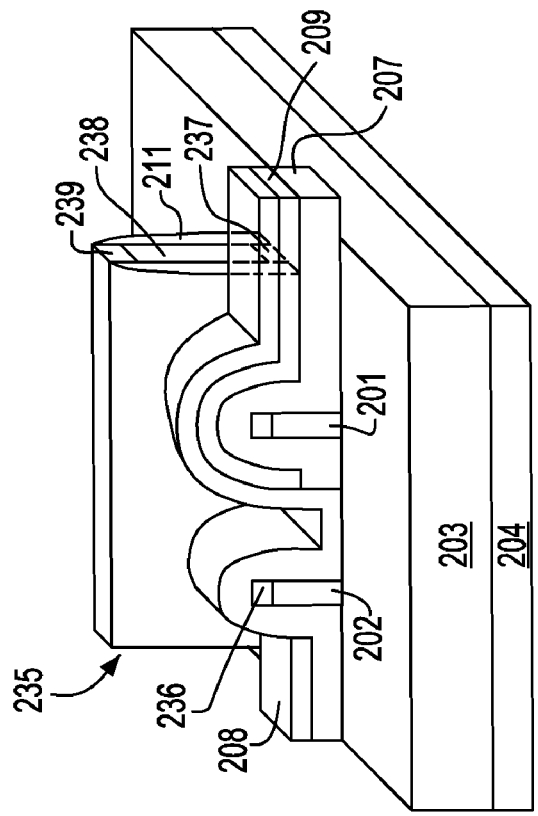
FIG. 15 is a perspective view of removing the block mask and depositing a second material layer doped with the second conductivity type dopant in direct contact with a remaining portion of the at least one dielectric layer in the first region and in direct contact with the second fin structure in the second region of the substrate, in accordance with one embodiment of the present disclosure.

FIG. 15 depicts one embodiment of removing the block mask 270 and depositing a second material layer 208 doped with the second conductivity type dopant in direct contact with a remaining portion of the at least one dielectric layer 209 in the first region of the substrate and in direct contact with the second fin structure 202 and the fin cap dielectric 236 that is overlying the second fin structure 202 in the second region of the substrate. The second conductivity type dopant is an opposite conductivity type as the first conductivity type dopant. For example, when the first conductivity type dopant is p-type, the second conductivity type dopant is n-type. The block mask 270 may be removed by selective etch processes, chemical strip methods, oxygen ashing or combinations thereof.

In one embodiment, in which the semiconductor device being formed in the second region of the substrate is an n-type finFET, the second conductivity type dopant of the second material layer 208 is an n-type dopant. As used herein, "n-type" refers to the addition of impurities that contributes free electrons to an intrinsic semiconductor. In a silicon-containing substrate examples of n-type dopants, i.e., impurities, include but are not limited to antimony, arsenic and phosphorous. The second material layer 208 may be composed of any material that can carry the second type dopant and is capable of diffusing the second type dopant into the second fin structure 202. In one embodiment, the second material layer 208 may be composed of a dielectric material, such as an oxide, nitride or oxynitride material. In one example, the second material layer 208 is composed of a silicate glass, such as a boron doped silicate glass.

The second material layer 208 may be deposited using chemical vapor deposition (CVD) including, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Other deposition methods that are suitable for depositing the second material layer 208 include, but are not limited to: spinning from solution, spraying from solution, chemical sputter deposition, reactive sputter deposition, ion-beam deposition, and evaporation. In one embodiment, the second material layer 208 is deposited using a conformal deposition process. The thickness of the second material layer 208 may range from 1 nm to 25 nm. In one embodiment, the thickness of the second material layer 208 ranges from 5 nm to 10 nm.

In one embodiment, the second conductivity type dopant is introduced to the second material layer 208 during the deposition process that forms the second material layer 208. In another embodiment, the second material layer 208 is deposited on the first and second region of the substrate, and the second conductivity type dopant is then introduced to the second material layer 208 after its deposition using ion implantation. The concentration of the second conductivity type dopant in the second material layer 208 may range from $1 \times 10^{19}$ atoms/cm$^3$ to $5 \times 10^{22}$ atoms/cm$^3$. In another embodiment, the concentration of the second conductivity type dopant in the second material layer 208 may range from $1 \times 10^{20}$ atoms/cm$^3$ to $1 \times 10^{22}$ atoms/cm$^3$. In yet another embodiment, the concentration of the second conductivity type dopant in the second material layer 208 may range from $2 \times 10^{21}$ atoms/cm$^3$ to $5 \times 10^{21}$ atoms/cm$^3$.

Figure 16:
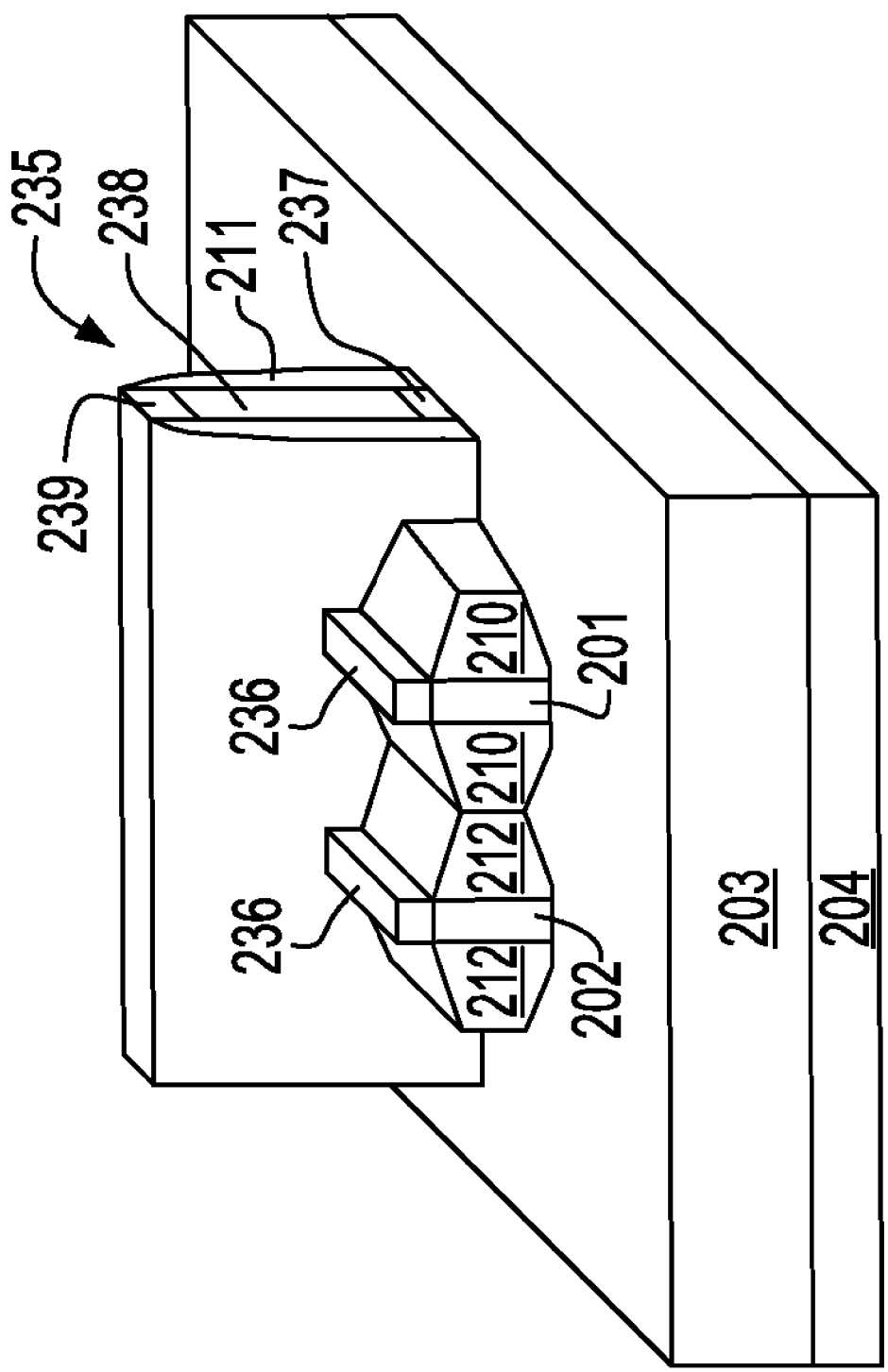
FIG. 16 is a perspective view of driving the first conductivity dopant from the first material layer into the first fin structure, and driving the second conductivity type dopant from the second material layer into the second fin structure, and forming raised source regions and raised drain regions, in accordance with one embodiment of the present disclosure.

FIG. 16 depicts one embodiment of driving the first conductivity dopant from the first material layer 207 into the first fin structure 201, and driving the second conductivity type dopant from the second material layer 208 into the second fin structure 202. In one embodiment, the dopant from the first material layer 207 and second material layer 208 is diffused into the first fin structure 201 and the second fin structure 202 by an annealing processes including, but not limited to, rapid thermal annealing, furnace annealing, flash lamp annealing or laser annealing. In one embodiment, thermal annealing to diffuse the dopant from the second material layer 208 and the first material layer 207 into the first fin structure 201 and the second fin structure 202 is conducted at a temperature ranging from 850° C. to 1350° C.

In one embodiment, in which the first conductivity type dopant in the first material layer 207 is a p-type dopant, the concentration of the p-type dopant of that diffuses into the first fin structure 201 ranges from $1 \times 10^{19}$ atoms/cm$^3$ to $1 \times 10^{21}$ atoms/cm$^3$. In another embodiment, the concentration of the p-type dopant that diffuses to the first fin structure 201 ranges from $4 \times 10^{19}$ atoms/cm$^3$ to $4 \times 10^{20}$ atoms/cm$^3$.

In one embodiment, in which the second conductivity type dopant in the second material layer 208 is doped to an n-type conductivity, the concentration of the n-type conductivity dopant that diffuses into the second fin structure 202 ranges from $1 \times 10^{19}$ atoms/cm$^3$ to $1 \times 10^{21}$ atoms/cm$^3$. In another embodiment, the concentration of the n-type conductivity dopant that diffuses to the second fin structure 202 ranges from $4 \times 10^{19}$ atoms/cm$^3$ to $4 \times 10^{20}$ atoms/cm$^3$.

FIG. 16 further depicts removing the first material layer 207, the at least one dielectric layer 209 and the second material layer 208 using an etch process that is selective to at least the dielectric cap layer 236, the first and second fin structures 201, 202, and the buried insulating layer, i.e., dielectric layer 203.

FIG. 16 also depicts one embodiment of forming first source and drain semiconductor material 210 on the sidewalls of the first fin structure 201, and forming second source and drain semiconductor material 212 on the sidewall of the second fin structure 202. In one embodiment, the first source and drain semiconductor material 210 and the second source and drain semiconductor material 212 is formed using an epitaxial growth process. For example, the first and second source and drain semiconductor materials 210, 212 may be composed of epitaxial silicon. A number of different sources may be used for the deposition of epitaxial silicon. Silicon sources for epitaxial growth include silicon tetrachloride, dichlorosilane ($SiH_2Cl_2$), and silane ($SiH_4$).

In one embodiment, the first source and drain semiconductor material 210 may be provided by selective-epitaxial growth of SiGe. The Ge content of the epitaxial grown SiGe may range from 5% to 50%, by atomic weight %. In another embodiment, the Ge content of the epitaxial grown SiGe may range from 10% to 20%. In one embodiment, the epitaxial grown SiGe produces a compressive strain in the portion of the first fin structure 201, in which the channel of a semiconductor device, such as a p-type conductivity finFET, is subsequently formed.

In one embodiment, the second source and drain semiconductor material 212 may be provided by selective epitaxial growth of Si:C, i.e., silicon doped with carbon. In one embodiment, the C content of the epitaxial grown Si:C ranges from 1% to 5%. In another embodiment, the C content of the epitaxial grown Si:C ranges from 1% to 2.5%. In one embodiment, the epitaxial grown Si:C produces a tensile strain in the portion of the second fin structure 202, in which the channel of a semiconductor device, such as an n-type conductivity finFET, is subsequently formed.

In one embodiment, the dopant for the first and second source and drain semiconductor materials 210, 212 may be introduced during the epitaxial growth process that produces the first and second source and drain semiconductor materials 210, 212. In some embodiments, the dopant for the first and second source and drain semiconductor material 210, 212 may be implanted after the epitaxial growth process using ion implantation.

In one embodiment, in which the first source and drain semiconductor material 210 provides the source and drain regions of a p-type finFET device, the first source and drain semiconductor material 210 may be doped with elements from group III of the Periodic Table of Elements. In one embodiment, the group III element is boron, aluminum, gallium or indium. In one example, in which the first source and drain semiconductor material 210 is doped to provide a p-type conductivity, the dopant may be boron present in a concentration ranging from $1 \times 10^{15}$ atoms/cm$^3$ to $5 \times 10^{15}$ atoms/cm$^3$.

In one example, source and drain semiconductor material 210 is composed of SiGe and is doped with boron to provide the raised source and drain regions of a p-type conductivity finFET.

In one embodiment, in which the second source and drain semiconductor material 212 provides the source and drain regions of an n-type finFET device, the second source and drain semiconductor material 212 may be doped with elements from group V of the Periodic Table of Elements. In one embodiment, the group V element is phosphorus, antimony or arsenic. In one example, the dopant concentration of the second source and drain semiconductor material 212 ranges from $5 \times 10^{19}$ atoms/cm$^3$ to $5 \times 10^{20}$ atoms/cm$^3$. In another embodiment, the second source and drain semiconductor material 212 has a dopant concentration ranging from $7 \times 10^{19}$ atoms/cm$^3$ to $2 \times 10^{20}$ atoms/cm$^3$.

Referring to FIGS. 10-16, the above process may provide a finFET semiconductor device that includes fin structures 201, 202 having a width W1 of less than 10.0 nm. The dopant from the first and second material layer 207, 208 diffuse through the entire width of the first and second fin structure 201, 202. In one embodiment, the crystal structure of the dopant regions in the first and second fin structure 201, 202 is damage-free. The term "damage-free" means that a single crystal lattice structure is present across the entire width of the first and second fin structure 201, 202. In contrast to a damage-free crystal structure, dopant regions that are formed in the first and second fin structures 201, 202 by ion implantation have a damaged region that may be present through at least a portion of the width of the fin structure. The damaged region disrupts the long range order of the crystalline structure of the single crystal lattice structure, i.e., the order and pattern in which the atoms of the material of the fin structure are arranged. The present method substantially eliminates the presence of damaged regions in the first and second fin structures 201, 202.

FIGS. 17-24 depict one embodiment of a method of fabricating a nanowire semiconductor device that does not use ion implantation to provide the source and drain extension regions of the device. Semiconductor devices composed of nanowires typically require ion implantation to form the source and drain extension regions. Ion implantation typically tends to amorphize the entire nanowire structure and generates implant-related defects. It is difficult to recrystallize the amorphous semiconductor and to eliminate implant defects during the subsequent low thermal budget anneal process that are typically utilized in semiconductor device manufacturing. In one embodiment, the method disclosed herein overcomes the disadvantages that result from ion implantation by forming the source and drain extension regions in the nanowire structure using an dielectric material layer carrying the dopant for the extension source and drain regions followed by an annealing process, wherein the annealing process drives the dopant from the doped dielectric material layer into the nanowire structure to form extension source and drain regions.

Figure 17:
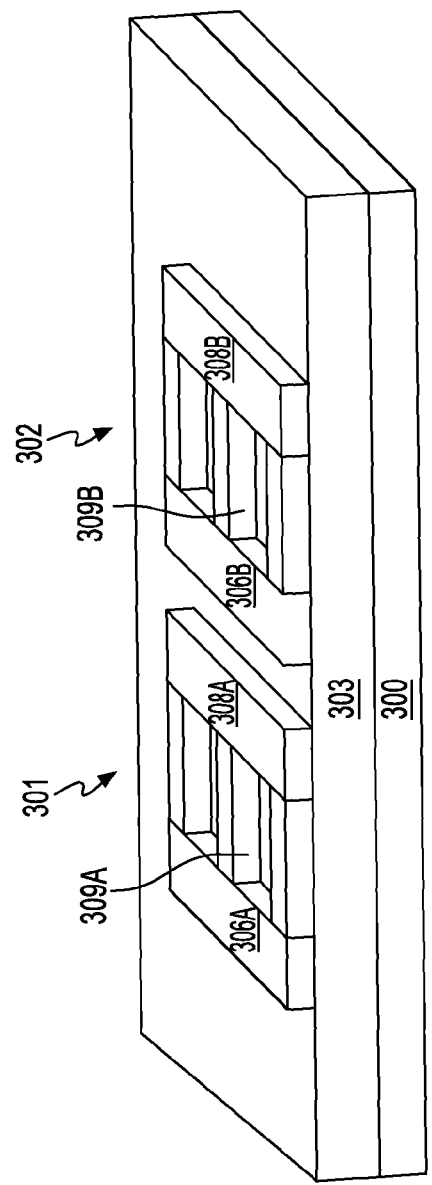
FIG. 17 is a perspective view of defining semiconductor on insulator (SOI) portions, i.e., first and second SOI portions, from an SOI layer of a semiconductor on insulator (SOI) substrate, in accordance with one embodiment of the present disclosure.

Referring to FIG. 17, and in one embodiment, semiconductor on insulator (SOI) portions 301, 302 are defined, i.e., patterned and etched, from the SOI layer of a semiconductor on insulator (SOI) substrate. The semiconductor on insulator (SOI) substrate includes a first semiconductor layer that provides the semiconductor on insulator (SOI) portions 301, 302, a dielectric layer 303 that is underlying the first semiconductor layer, and a second semiconductor layer 300 that is under the dielectric layer 303. In some embodiments, when the first semiconductor layer is less than 10 nm thick, the SOI substrate may be referred to as an extremely thin semiconductor on insulator (ETSOI) substrate. The SOI and ETSOI substrates that are described above in the embodiments of the invention depicted in FIGS. 1-16 are suitable for providing the first and second SOI portions 301, 302.

The first SOI portion 301 may be subsequently processed to provide a p-type semiconductor device in which the channel of the device is positioned in a first nanowire portion 309A. The second SOI portion 302 may be subsequently processed to provide a p-type semiconductor device in which the channel of the device is positioned in a second nanowire portion 309B. Each of the SOI portions 301 may include SOI pad regions 306A, 306B, 308A, 308B, and nanowire portions 309A, 309B.

Figure 18:
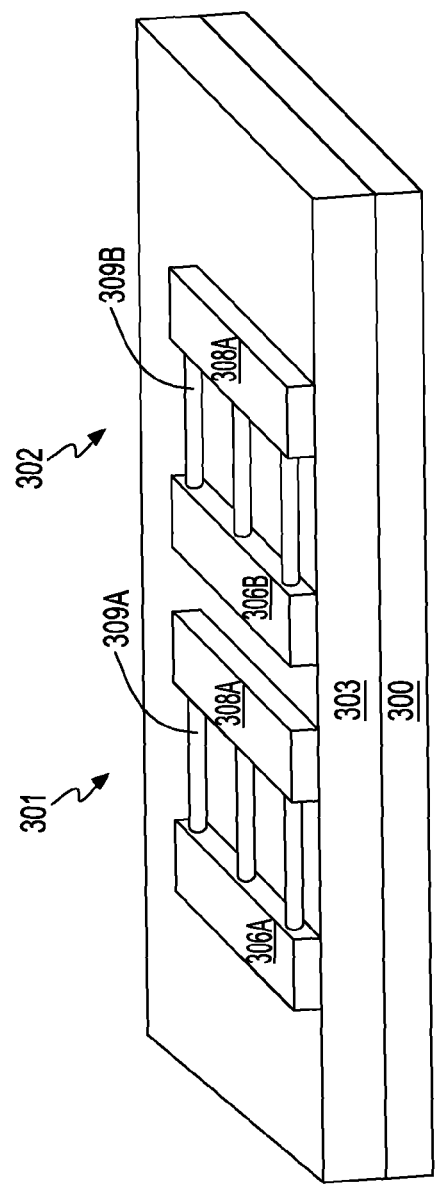
FIG. 18 is a perspective view of smoothing the nanowire portions of the first and second SOI portions of the substrate, in accordance with one embodiment of the present disclosure.

Referring to FIG. 18, in some embodiments, following the formation of the semiconductor on insulator (SOI) portions 301, 302, portions of the dielectric layer 303 that are under the semiconductor on insulator (SOI) portions 301, 302 are removed by an isotropic etching process that forms undercut regions, which the first and second nanowire portions 309A, 309B are suspended over. The isotropic etching results in the lateral etching of portions of the dielectric layer 303 that are under the nanowire portions 309A, 309B. The lateral etch suspends the nanowire portions 309A, 309B above the dielectric layer 303. The isotropic etching of the dielectric layer 303 may be, for example, performed using a diluted hydrofluoric acid (DHF). In one example, a 100:1 DHF etches approximately 2 to 3 nm of dielectric layer 303 per minute at room temperature. It is noted that in some embodiments, the isotropic etch process may be omitted so that the nanowire portions 309A, 309B have a bottom surface that is in direct contact with the upper surface of the dielectric layer 303.

Still referring to FIG. 18, the nanowire portions 309A, 309B are smoothed to form elliptical shaped (and in some cases, cylindrical shaped) nanowires. In one embodiment, the smoothing of the nanowire portions 309A, 309B may be performed by annealing of the nanowire portions 309A, 309B in hydrogen. Example annealing temperatures may range from 600° C. to 1000° C. In one example, the hydrogen pressure of the process to smooth the nanowire portions 309A, 309B ranges from 600 torr to 7 torr.

In another embodiment, the reduction of the dimensions of the nanowire portions 309A, 309B may be provided by a high temperature oxidation of the nanowire portions 309A, 309B followed by etching of the grown oxide. The oxidation and etching process may be repeated to achieve a desired nanowire dimensions. In one embodiment, the diameter of a circular nanowire portion 309A, 309B is less than 30 nm. In another embodiment, the diameter of the circular nanowire portion 309A, 309B ranges from 2 nm to 15 nm. In yet another, embodiment, the diameter of the circular nanowire portions 309A, 309B ranges from 5 nm to 10 nm.

FIG. 19 depicts one embodiment of forming a first gate structure 402A in direct contact with the first nanowire portion 309A of the first SOI portion 301, and a second gate structure 402B in direct contact with the second nanowire portion 309B of the second SOI portion 302. Each of the first and second gate structures 402A, 402B include at least one gate dielectric 311A, 311B and at least one gate conductor 312A, 312B. In the embodiments in which the first and second nanowire portions 309A, 309B are suspended over the dielectric layer 303, the at least one gate dielectric 311A, 311B is formed around the entirety of the circumference, i.e., over and around, of the first and second nanowire portions 309A, 309B. In the embodiments, in which the first and second nanowire portions 309A, 309B are present on an upper surface of the dielectric layer 303, the at least one gate dielectric 311A, 311B is formed over the exposed portion of the first and second nanowire portions 309A, 309B that are not in direct contact with the dielectric layer 303. The positioning of the at least one gate dielectric 311A, 311B separates the first and second nanowire portions 309A, 309B from the gate conductors 312A, 312B. In one example, the at least one dielectric layer 311A, 311B may be composed of at least one of $SiO_2$, SiON, or $HfO_2$ (or other hi-K material). It is noted that the material, thickness and deposition method for the at least one dielectric layer 311A, 311B is similar to the first and second gate dielectric 39, 43 that are described above with reference to FIG. 1. Therefore, the description of the first and second gate dielectric 39, 43 of the structure depicted in FIG. 1, is equally applicable to the at least one dielectric layer 311A, 311B that is depicted in FIG. 19.

A first gate conductor 312A is present on the first gate dielectric 311A, and a second gate conductor 312B is present on the second gate dielectric 311B. In one embodiment, the first and second gate conductors 312A, 312B are composed of doped polysilicon. Doping the polysilicon with impurities, such as boron (p-type), or phosphorus (n-type), makes the first and second gate conductors 312A, 312B conductive. It is noted that the material, thickness and deposition method for forming the first and second gate conductors 312A, 312B is similar to the at least one gate conductor 37, 42 that is described above with reference to FIG. 1. Therefore, the description of the at least one gate conductor 37, 42 of the structure depicted in FIG. 1, is equally applicable to first and second gate conductor 312A, 312B that is described in FIG. 19.

The first and second gate structures 402A, 402B may be capped with a dielectric cap 313A, 313B. The dielectric cap 313A, 313B may function as a hard mask for each of the first and second gate structures 402A, 402B and may facilitate etch process steps to form the first and second gate structures 402A, 402B. It is noted that the material, thickness and deposition method for forming the dielectric cap 313A for the structure depicted in FIG. 19 is similar to the dielectric cap 38 that is described above with reference to FIG. 1. Therefore, the description of the dielectric cap 38 of the structure depicted in FIG. 1, is equally applicable to the dielectric cap 38 that is described in FIG. 19. Although not depicted in the supplied figures, a metal nitride layer, such as, for example, TaN or TiN, may be present between the first and second gate conductors 312A, 312B and the first and second gate dielectrics 311A, 311B.

FIG. 20 illustrates one embodiment of forming sidewall spacers 314A, 314B along the sidewalls of the first and second gate structures 402A, 402B. The spacers 314A, 314B are formed by depositing a blanket dielectric film such as silicon nitride and etching the dielectric film with an anisotropic etch, such as RIE. The spacers 314A, 314B are formed around and over the first and second gate structure 402A, 402B. It is noted that the material, and thickness of the sidewalls spacers 314A, 314B for the structure depicted in FIG. 19 is similar to the first sidewall spacers 11 that are described above with reference to FIG. 1. Therefore, the description of the first sidewall spacers 11 of the structure depicted in FIG. 1, is equally applicable to the sidewalls spacers 314A, 314B that are depicted in FIG. 20.

Figure 21:
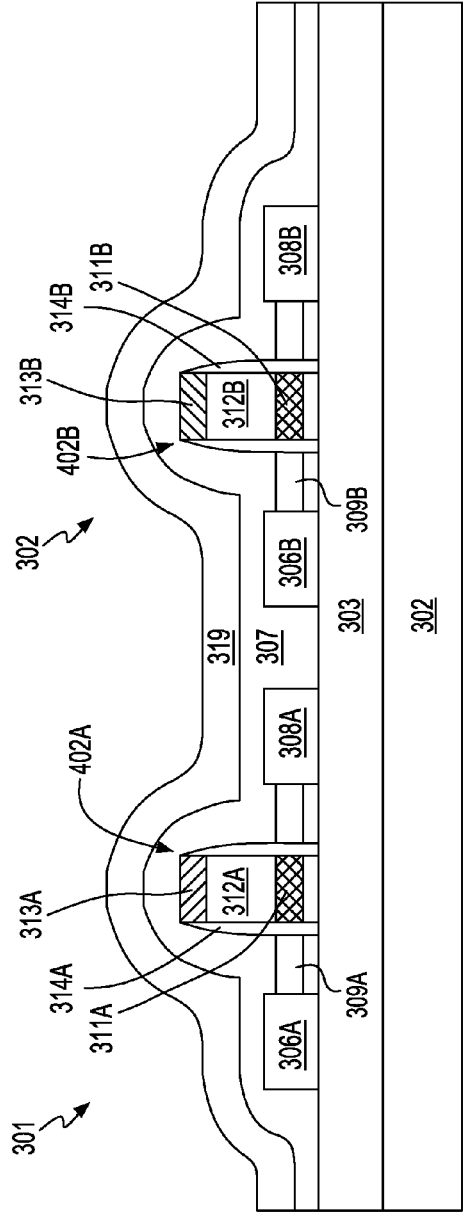
FIG. 21 is a side cross-sectional view depicting depositing a first material layer doped with the first conductivity type dopant on the first and second SOI portions, and forming at least one dielectric layer on the first material layer, in accordance with one embodiment of the present disclosure.

FIG. 21 depicts one embodiment of depositing a first material layer 307 doped with the first conductivity type dopant on the first SOI portion 301 and the second SOI portion 302 of the substrate. In one embodiment, in which the semiconductor device being formed in the first SOI region 301 of the substrate is a p-type nanowire semiconductor device, the first conductivity type dopant of the first material layer 307 is a p-type dopant, including but not limited to, boron, aluminum, gallium and indium. The first material layer 307 may be composed of any material that can carry the first type dopant and is capable of diffusing the first type dopant into the underlying nanowire portion 309A of the first SOI portion 301. In one embodiment, the first material layer 307 may be composed of a dielectric material, such as an oxide, nitride or oxynitride material. In another embodiment, the first material layer 307 is a semiconductor material, such as polysilicon or single crystal silicon. In one example, the first material layer 307 is composed of a silicate glass, such as a boron doped silicate glass.

In one embodiment, the first material layer 307 is blanket deposited atop the structure depicted in FIG. 20 including the first nanowire portion 309A of the first SOI portion 301, and the second nanowire portion 309B of the secon SOI portion 302. The first material layer 307 may be deposited using chemical vapor deposition (CVD) including, but not limited to, Atmospheric Pressure CVD (APCVD), Low Pressure CVD (LPCVD) and Plasma Enhanced CVD (EPCVD), Metal-Organic CVD (MOCVD) and combinations thereof. Other deposition methods that are suitable for depositing the first material layer 307 include, but are not limited to: spinning from solution, spraying from solution, chemical sputter deposition, reactive sputter deposition, ion-beam deposition, and evaporation. In one embodiment, the first material layer 307 is deposited using a conformal deposition process. The thickness of the first material layer 307 may range from 1 nm to 25 nm. In one embodiment, the thickness of the first material layer 307 ranges from 5 nm to 10 nm.

In one embodiment, the first conductivity type dopant is introduced to the first material layer 307 during the deposition process that forms the first material layer 307. In another embodiment, the first conductivity type dopant is introduced to the first material layer 307 after its deposition using ion implantation. The concentration of the first conductivity type dopant in the first material layer 307 may range from $1 \times 10^{19}$ atoms/cm$^3$ to $3 \times 10^{22}$ atoms/cm$^3$. In another embodiment, the concentration of the first conductivity type dopant in the first material layer 307 may range from $1 \times 10^{20}$ atoms/cm$^3$ to $1 \times 10^{22}$ atoms/cm$^3$. In yet another embodiment, the concentration of the first conductivity type dopant in the first material layer 307 may range from $2 \times 10^{21}$ atoms/cm$^3$ to $5 \times 10^{21}$ atoms/cm$^3$.

FIG. 21 further depicts forming at least one dielectric layer 319 on the first material layer 307. In one embodiment, the at least one dielectric layer 319 may be formed on the first material material layer 307 overlying both the first SOI portion 301 and the second SOI portion 302. The at least one dielectric layer 319 may be formed by a thermal growth process such as, for example, oxidation, nitridation or oxynitridation. The at least one dielectric layer 319 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. In one embodiment, the at least one dielectric layer 319 is deposited using a conformal deposition process. The at least one dielectric layer 319 may be composed of an oxide, nitride or oxynitride material. It is noted that the material, and thickness of the at least one dielectric layer 319 for the structure depicted in FIG. 21 is similar to the at least one dielectric layer 9 that is described above with reference to FIG. 2. Therefore, the description of the least one dielectric layer 9 of the structure depicted in FIG. 2, is equally applicable to the least one dielectric layer 319 that is depicted in FIG. 21.

Figure 22:
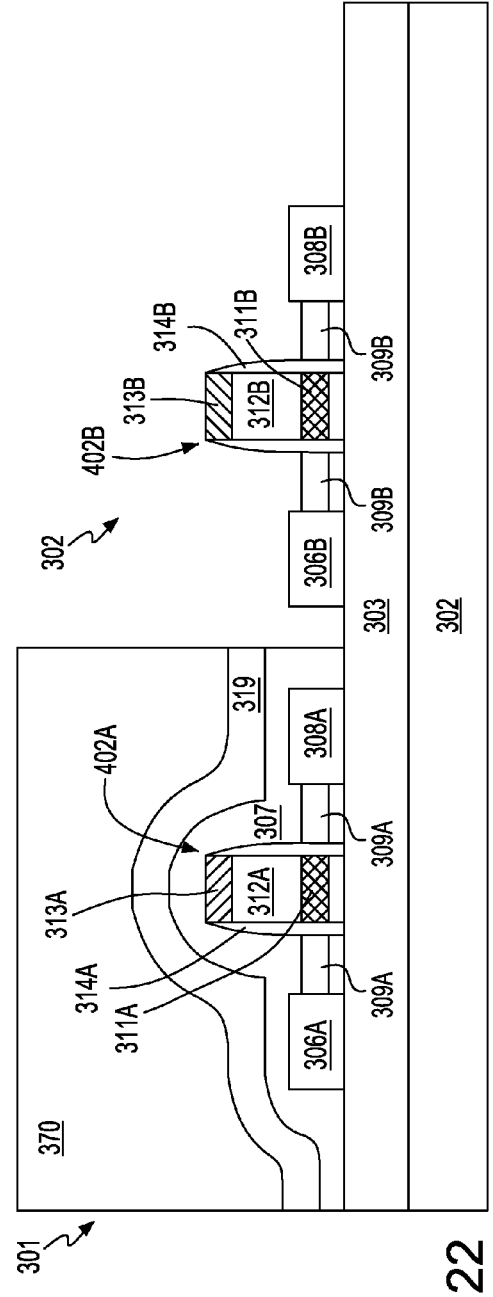
FIG. 22 is a side cross-sectional view depicting forming a block mask on the at least one dielectric layer over the first SOI portion, and etching an exposed portion of the at least one dielectric layer and an underlying portion of the first material layer selective to the block mask, in accordance with one embodiment of the present disclosure.

FIG. 22 depicts one embodiment of forming a block mask 370 on the at least one dielectric layer 319 over the first SOI portion 301, and etching an exposed portion of the at least one dielectric layer 319 and an underlying portion of the first material layer 307 selective to the block mask 370 to expose at least the nanowire portion 309B in the second region of the substrate containing the second SOI portion 302. In one embodiment, the block mask 370 is formed protecting the portion of the at least one dielectric layer 3199 and the first material layer 307 that are present over the first SOI portion in which at least one p-type nanowire semiconductor device is subsequently formed. The exposed portion of the at least one dielectric layer 3199 and the first material layer 307 that are not protected by the block mask 370 are subsequently removed.

The block mask 370 may comprise soft and/or hardmask materials and can be formed using deposition, photolithography and etching. It is noted that the material, thickness and method of producing of the block mask 370 depicted in FIG. 22 is similar to the block mask 70 that is described above with reference to FIG. 3. Therefore, the description of the block mask 370 depicted in FIG. 3, is equally applicable to the block mask 370 that is described with reference to FIG. 22.

In one embodiment, following the formation of the block mask 370, a selective etch process may be utilized to remove the exposed portion of the at least one dielectric layer 319 and the first material layer 307. In one embodiment, the selective etch process includes a first etch chemistry for removing the exposed portion of the at least one dielectric layer 319 selective to the underlying portion of the first material layer 307 and selective to the block mask 370. A second etch chemistry may then remove the exposed portion of the first material layer 307 selective to the underlying portion of the second nanowire portion 309B of the second SOI portion 302, and selective to the block mask 370. The second etch chemistry is also selective to the second gate structure 402B and the sidewall spacers 314B that are present adjacent to the second gate structure 402B.

FIG. 23 depicts one embodiment of removing the block mask 370 and depositing the second material layer 320 doped with the second conductivity type dopant in direct contact with a remaining portion of the at least one dielectric layer 319 that is present on the first SOI portion 301 and in direct contact with the second nanowire portion 309B of the second SOI portion 302 in the second region of the substrate. The second conductivity type dopant is an opposite conductivity type as the first conductivity type dopant. For example, when the first conductivity type dopant is p-type, the second conductivity type dopant is n-type. The block mask 370 may be removed by selective etch processes, chemical strip methods, oxygen ashing or combinations thereof.

In one embodiment, in which the semiconductor device being formed from the second SOI portion 302 is an n-type nanowire semiconductor device, the second conductivity type dopant of the second material layer 320 is an n-type dopant. In a second SOI portion 302 that is composed of silicon, examples of n-type dopants include, but are not limited to, antimony, arsenic and phosphorous. The second material layer 320 may be composed of any material that can carry the second type dopant and is capable of diffusing the second type dopant into the underlying second nanowire portion 309B of the second SOI portion 302. In one embodiment, the second material layer 320 may be composed of a dielectric material, such as an oxide, nitride or oxynitride material. In another embodiment, the second material layer 320 is a semiconductor material, such as polysilicon or single crystal silicon. In one example, the second material layer 320 is composed of a silicate glass, such as a boron doped silicate glass.

The second material layer 320 may be deposited using chemical vapor deposition (CVD) including, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Other deposition methods that are suitable for depositing the second material layer 320 include, but are not limited to: spinning from solution, spraying from solution, chemical sputter deposition, reactive sputter deposition, ion-beam deposition, and evaporation. In one embodiment, the second material layer 320 is deposited using a conformal deposition process. The thickness of the second material layer 320 may range from 1 nm to 25 nm. In one embodiment, the thickness of the second material layer 320 ranges from 5 nm to 10 nm.

In one embodiment, the second conductivity type dopant is introduced to the second material layer 320 during the deposition process that forms the second material layer 320. In another embodiment, the second conductivity type dopant is introduced to the second material layer 320 after its deposition using ion implantation. The concentration of the second conductivity type dopant in the second material layer 320 may range from $1 \times 10^{19}$ atoms/cm$^3$ to $3 \times 10^{22}$ atoms/cm$^3$. In another embodiment, the concentration of the second conductivity type dopant in the second material layer 8 may range from $1 \times 10^{20}$ atoms/cm$^3$ to $1 \times 10^{22}$ atoms/cm$^3$. In yet another embodiment, the concentration of the second conductivity type dopant in the second material layer 8 may range from $2 \times 10^{21}$ atoms/cm$^3$ to $5 \times 10^{21}$ atoms/cm$^3$.

FIG. 24 depicts one embodiment of driving the first conductivity dopant from the first material layer 307 into the first nanowire portion 309A of the first SOI portion 301, and driving the second conductivity type dopant from the second material layer 320 into the second nanowire portion 309B of the second SOI portion 302. The first and second conductivity dopant being introduced to the first and second nanowire portions 309A, 309B provide the source and drain extension regions of the n-type and p-type nanowire devices that are formed from the first and second SOI portions 301, 302. In one embodiment, the dopant from the first material layer 307 and second material layer 320 is diffused into the nanowire portions 309A, 309B of the first and second SOI portions 301, 302 by an annealing processes including, but not limited to: rapid thermal annealing, furnace annealing, flash lamp annealing or laser annealing. In one embodiment, the thermal annealing is conducted at a temperature ranging from 850° C. to 1350° C.

In one embodiment, in which the first conductivity type dopant in the first material layer 307 is a p-type dopant, the source extension region and drain extension region that are formed in the first nanowire portion 309A of the first SOI portion 301 have a p-type conductivity. Typically, the dopant concentration of the source extension region and drain extension region having the p-type conductivity ranges from $1 \times 10^{19}$ atoms/cm$^3$ to $5 \times 10^{21}$ atoms/cm$^3$. In another embodiment, the source extension region and drain extension region having the p-type conductivity ranges from $4 \times 10^{19}$ atoms/cm$^3$ to $4 \times 10^{20}$ atoms/cm$^3$.

In one embodiment, in which the second conductivity type dopant in the second material layer 320 is doped to an n-type conductivity, the source extension region and drain extension region that are formed in the second nanowire portion 309B of the second SOI portion 302 have an n-type conductivity. Typically, the dopant concentration of the source extension region and drain extension region having the n-type conductivity ranges from $1 \times 10^{19}$ atoms/cm$^3$ to $1 \times 10^{21}$ atoms/cm$^3$. In another embodiment, the source extension region and drain extension region having the n-type conductivity ranges from $4 \times 10^{19}$ atoms/cm$^3$ to $4 \times 10^{20}$ atoms/cm$^3$.

The above process scheme provides a nanowire semiconductor device that does not use ion implantation to provide the source and drain extension regions of the device. In one embodiment, the method disclosed herein overcomes the disadvantages that result from ion implantation by forming the source and drain extension regions in the nanowire portions 309A, 309B using a material layer, such as a dielectric material layer, to carry the dopant for the extension source and drain regions followed by an annealing process, wherein the annealing process drives the dopant into the nanowire structure to form extension source and drain regions. This provides source and drain extension regions within the nanowire portions 309A, 309B having a damage-free crystal structure. The term "damage-free" means that a single crystal lattice structure is present throughout the entirety of the source and drain extension regions that are present in the nanowire portions 309A, 309B.

Although not shown in the Figures, the SOI pad regions 306A, 306B, 308A, 308B may be ion implanted to provide deep source regions and deep drain regions of the device. The deep source and drain regions have the same conductivity dopant as the source and drain extension regions, but the deep source and drain regions typically have a greater dopant concentration then the source and drain extension regions. In another embodiment, raised source and drain regions may be formed on the SOI pad regions 306A, 306B, 308A, 308B. The raised source and drain regions have the same conductivity dopant as the source and drain extension regions, but the raised source and drain regions typically have a greater dopant concentration then the source and drain extension regions. A metal semiconductor alloy, such as a silicide, may be formed on the upper surface of the SOI pad regions 306A, 306B, 308A, 308B, or the raised source and drain regions. Following the formation of the metal semiconductor alloy, back end of the line (BEOL) processing may be employed to provide connectivity to the device.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
    etching a semiconductor layer of an SOI substrate to provide a nanowire portion;
    forming a gate structure on a nanowire portion of the SOI substrate;
    forming a doped dielectric layer over at least a portion of the semiconductor layer that is adjacent to the gate structure;
    driving the dopant from the doped dielectric layer into the portion of the semiconductor layer that is adjacent to the gate structure, wherein the dopant provides source and drain regions in the semiconductor surface;
    removing the doped dielectric layer to expose the semiconductor layer, and
    forming raised source and drain regions on the semiconductor layer on opposing sides of the gate structure.

2. The method of claim 1, wherein the forming of the gate structure comprises forming at least one gate dielectric layer on the nanowire portion, forming at least one gate conductor layer on the at least one gate dielectric layer, and forming at least one dielectric cap layer on the at least one gate conductor layer to provide a gate stack; forming a first etch mask on the gate stack; etching the gate stack selective to the first etch mask; and forming dielectric spacers on sidewalls of the gate structure.

3. The method of claim 1, wherein the forming the doped dielectric layer includes selecting an oxide doped with a first conductivity type dopant or a second conductivity type dopant.

4. The method of claim 3, wherein the oxide of the doped dielectric layer comprises a silicate glass, the first conductivity type dopant is boron, and the second conductivity type dopant is arsenic.

5. The method of claim 1, wherein the driving of the dopant from the doped dielectric layer into the portion of the semiconductor surface that is adjacent to the gate structure comprises annealing.

6. The method of claim 1, wherein the removing of the doped dielectric layer comprises etching the doped dielectric layer selective to the semiconductor surface.

7. The method of claim 1, wherein the forming of the raised source and drain regions on the semiconductor layer comprises epitaxial growth of a semiconductor material.

8. The method of claim 7, wherein the raised source and drain regions are doped with a conductivity type dopant that is the same as the source and drain regions in the semiconductor surface, wherein the raised source and drain regions are in-situ doped during epitaxial growth, are doped using ion implantation or are doped using a combination of epitaxial growth and ion implantation.

9. The method of claim 1, wherein the substrate further comprises strain inducing wells on opposing sides of the gate structure, wherein the strain inducing wells induces a compressive strain or a tensile strain on a channel region of the device.

10. A method of forming a complementary metal oxide semiconductor (CMOS) device comprising:
    providing a semiconductor substrate having a first region and a second region, wherein the semiconductor substrate comprises a nanowire comprised of a semiconductor-containing material;
    forming a first gate structure in the first region of the semiconductor substrate and a second gate structure in the second region of the semiconductor substrate;
    forming a first material layer doped with a first conductivity type dopant over the first region of the semiconductor substrate, and a second material layer doped with a second conductivity type dopant over the second region of the semiconductor substrate, wherein the first conductivity type dopant is of an opposite conductivity than the second conductivity type dopant;
    diffusing the first conductivity dopant into the first region of the semiconductor substrate on opposing sides of the first gate structure and the second conductivity type dopant into the second region of the semiconductor substrate on opposing sides of the second gate structure, wherein the first conductivity type dopant that is diffused into the first region of the semiconductor substrate provides a first conductivity type source extension region and a first conductivity type drain extension region, and the second conductivity type dopant that is diffused into the second region of the semiconductor substrate provides a second conductivity type source extension region and a second conductivity type drain extension region;
    removing the first material layer and the second material layer; and forming raised source regions and raised drain regions in the first region and the second region of the semiconductor substrate.

11. The method of claim 10, wherein the first conductivity type dopant is p-type and the second conductivity type dopant is n-type.

12. The method of claim 11, wherein the semiconductor substrate further comprises strain inducing wells on opposing sides of the gate structure in the first region and the second region.

* * * * *